(12) United States Patent
Itsuji

(10) Patent No.: US 8,067,739 B2
(45) Date of Patent: Nov. 29, 2011

(54) PHOTOCONDUCTIVE ELEMENT FOR GENERATION AND DETECTION OF TERAHERTZ WAVE

(75) Inventor: Takeaki Itsuji, Hiratsuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 659 days.

(21) Appl. No.: 12/141,005

(22) Filed: Jun. 17, 2008

(65) Prior Publication Data

US 2008/0315098 A1 Dec. 25, 2008

(30) Foreign Application Priority Data

Jun. 22, 2007 (JP) ................................. 2007-164439

(51) Int. Cl.
*G21G 4/00* (2006.01)
*G01J 5/20* (2006.01)

(52) U.S. Cl. .................. 250/338.4; 250/493.1

(58) Field of Classification Search ............... 250/338.1, 250/338.4, 339.01, 340, 493.1, 495.1
See application file for complete search history.

(56) References Cited

U.S. PATENT DOCUMENTS

| | | | |
|---|---|---|---|
| 6,448,553 B1 | 9/2002 | Itsuji et al. | |
| 6,835,925 B2 | 12/2004 | Itsuji et al. | |
| 7,248,995 B2 | 7/2007 | Itsuji et al. | |
| 7,358,918 B2 | 4/2008 | Itsuji | |
| 2007/0030115 A1 | 2/2007 | Itsuji et al. | |
| 2007/0235718 A1 | 10/2007 | Kasai et al. | |
| 2008/0165062 A1 | 7/2008 | Itsuji | |

FOREIGN PATENT DOCUMENTS

| | | |
|---|---|---|
| JP | 3165653 | 3/2001 |
| JP | 2004-112397 | 4/2004 |
| JP | 2006-10319 | 1/2006 |

OTHER PUBLICATIONS

Tani, et al., "Emission characteristics of photoconductive antennas based on low-temperature-grown GaAs and semi-insulating GaAs", Applied Optics, vol. 36, No. 30, Oct. 20, 1997, pp. 7853-7859.
U.S. Appl. No. 12/023,863, filed Jan. 31, 2008, Takeaki Itsuji.
U.S. Appl. No. 10/587,262, international filing Mar. 22, 2006, Takeaki Itsuji.

*Primary Examiner* — Mark R Gaworecki
(74) *Attorney, Agent, or Firm* — Fitzpatrick, Cella, Harper & Scinto

(57) ABSTRACT

A photoconductive element for generating or detecting a terahertz wave comprises a carrier generation layer for generating carriers on light irradiation, a pair of conductive electrodes provided in opposition on one face of the carrier generation layer, each containing a strip line, a pair of conductive antennas placed in opposition with a gap for light irradiation onto the carrier generation layer, each being joined to the electrodes, a pair of conductive adjusting stubs for adjusting a propagation state of the terahertz wave generated or detected by the carriers, wherein each of the adjusting stubs has a length of not longer than the wavelength $\lambda$ of the terahertz wave generated by the carriers, and is placed at a distance of not more than the wavelength $\lambda$ from a joint between the antenna and the electrode.

25 Claims, 14 Drawing Sheets

(780nm PULSE)

(1550nm PULSE)

PHOTOCONDUCTIVE ELEMENT FOR GENERATION AND DETECTION OF TERAHERTZ WAVE

BACKGROUND OF THE INVENTION

1. Field of the Invention

The present invention relates to a photoconductive element for generation and/or detection of terahertz wave. The present invention relates also to an analysis apparatus, an imaging apparatus, and a communication apparatus employing the photoconductive element. The present invention relates also to a technique for adjusting the propagation state of a terahertz wave by selecting the electrode construction of the photoconductive element. In the present invention, the term "terahertz wave" denotes an electromagnetic wave occupying any portion of the frequency band ranging from 0.03 THz to 30 THz.

2. Description of the Related Art

The terahertz wave band covers characteristic absorption bands stemming from structures and states of various substances including biological molecules. By utilizing the characteristic absorption, inspection techniques are being studied for nondestructive analysis and identification of materials. These techniques are promising for safe imaging in place of X-ray radiography, and high-speed communication.

A photoconductive element is useful as an element for generation or detection of a terahertz wave. The photoconductive element has a semiconductor layer for generating carriers, and electrodes patterned with an interspace on the semiconductor layer for applying a voltage thereto. For improving the spatial coupling efficiency, an antenna structure may be provided on the parts of the electrodes with an antenna gap. On projection of a light beam to the antenna gap, carriers are generated in the semiconductor layer. The carriers are accelerated by application of a voltage between the electrodes to emit a terahertz wave from the photoconductive element.

The propagation characteristics of the terahertz wave in the photoconductive element depend generally on the state of carrier propagation as well as on the antenna structure. Herein the state of the carrier propagation includes the carrier behavior and the influence of the employed members such as absorption of phonon characteristic to the semiconductor substrate. For example, of the antenna for emission and reception of an electromagnetic wave, a bow-tie antenna has a broader band characteristics than a dipole antenna. However, for the photoconductive element to emit or receive terahertz wave, the dipole antenna is more suitable than the bow-tie antenna to obtain a terahertz wave in a broader frequency property range depending on the carrier propagation state. Appl. Optics 36, 7853 (1997) (hereinafter referred to as "Non-patent Document 1") below discloses the above-mentioned matter. Japanese Patent Application Laid-Open No. 2006-010319 (hereinafter referred to as "Patent Document 1") below discloses a method for controlling the propagation state of the terahertz wave generated or detected by the carrier by use of the bow-tie antenna in a photoconductive element.

The technique disclosed in Patent Document 1 is widely employed for controlling the propagation state of the terahertz wave generated or detected by the carriers by changing the structure of the antenna of the photoconductive element. Such a method of adjustment is effective, but requires an additional step for structure formation.

SUMMARY OF THE INVENTION

The present invention intends to provide a photoconductive element which is capable of adjusting the propagation state, especially the frequency characteristics, of the terahertz wave.

The present invention is directed to a photoconductive element for generating or detecting a terahertz wave, comprising: a carrier generation layer for generating carriers on light irradiation; a pair of conductive electrodes provided in opposition on one face of the carrier generation layer, each containing a strip line; a pair of conductive antennas placed in opposition with a gap for light irradiation onto the carrier generation layer, each being joined to the electrodes; a pair of conductive adjusting stubs for adjusting a propagation state of the terahertz wave generated or detected by the carriers; wherein each of the adjusting stubs has a length of not longer than the wavelength $\lambda$ of the terahertz wave generated by the carriers, and is placed at a distance of not more than the wavelength $\lambda$ from a joint between the antenna and the electrode.

The present invention is directed to a photoconductive element for generating or detecting a terahertz wave, comprising:

a carrier generation layer for generating carriers on light irradiation; a pair of conductive electrodes provided in opposition on one face of the carrier generation layer, each containing a strip line; a pair of conductive antennas placed in opposition with a gap for light irradiation onto the carrier generation layer, each being joined to the electrodes; a pair of conductive adjusting stubs for adjusting a propagation state of the terahertz wave generated or detected by the carriers; wherein each of the adjusting stubs has a length of not longer than the wavelength $\lambda$ of the terahertz wave generated by the carriers, and is joined to extension of the strip line, and the end of the adjusting stub is placed at a distance of not more than the wavelength $\lambda$ from a joint between the antenna and the electrode.

Each of the conductive adjusting stubs can be joined to extension of the strip line, and has a length ranging from $0.5\lambda$ to $0.8\lambda$ from the joint between the antenna and the electrode, and thereby the pair of the adjusting stubs level a frequency characteristic of the terahertz wave generated or detected by the carriers.

Each of the conductive adjusting stubs is joined to extension of the strip line, and has a length ranging from $0.1\lambda$ to $0.5\lambda$ from the joint between the antenna and the electrode, and thereby the pair of the adjusting stubs localize a frequency characteristic of the terahertz wave generated or detected by the carriers.

The present invention is directed to a photoconductive element for generating or detecting a terahertz wave, comprising: a carrier generation layer for generating carriers on light irradiation;

a pair of conductive electrodes provided on one face of the carrier generation layer and each containing a strip line in opposition; a pair of conductive antennas placed in opposition with a gap for light irradiation onto the carrier generation layer, and each being joined to the electrodes; a pair of conductive adjusting stabs for adjusting a propagation state of the terahertz wave generated or detected by the carriers; wherein each of the adjusting stubs has a length of not longer than the wavelength $\lambda$ of the terahertz wave generated by the carriers, and is joined to the electrode at the outside edge of the strip line at a distance of not more than the wavelength $\lambda$ from a joint between the antenna and the electrode.

Each of the adjusting stubs can have a length ranging from 0.1λ to 0.2λ, and is joined to the outside edge of the strip line at a distance equal to the length of the stub from the joint between antenna and the electrode, whereby the adjusting stubs level the frequency characteristic of the terahertz wave generated or detected by the carriers.

Each of the adjusting stubs can have a length ranging from 0.2λ to 0.5λ, and is joined to the outside edge of the strip line at a distance equal to the length of the stub from the joint between antenna and the electrode, whereby the adjusting stubs localize the frequency characteristic of the terahertz wave generated or detected by the carriers.

The present invention is directed to a photoconductive element for generating or detecting a terahertz wave, comprising a carrier generation layer for generating carriers on irradiation of a beam of light, a first electrode provided on a face of the carrier generation layer, a second electrode provided on the face of the carrier generation layer placed in opposition to the first electrode, wherein the first electrode and the second electrode have respectively an antenna, the beam of light is projected onto a spot in a gap of the antennas joined to the first electrode and the second electrode, and at least one of the ends of the first electrode and the second electrode is placed at a distance from the spot of the light projection of not longer than twice the interspace d between the first electrode and the second electrode.

The present invention is directed to a photoconductive element for generating or detecting a terahertz wave, comprising a carrier generation layer for generating carriers on irradiation of a beam of light, a first electrode provided on a face of the carrier generation layer, a second electrode provided on the face of the carrier generation layer placed in opposition to the first electrode,
wherein the first electrode and the second electrode have respectively an antenna, the beam of light is projected onto a spot in a gap of the antennas joined to the first electrode and the second electrode, and a pair of conductive adjusting stubs are placed in opposition on the first electrode and second electrode at a distance from the spot of the light projection of not longer than twice the interspace d between the first electrode and the second electrode.

The present invention is directed to a photoconductive element for generating or detecting a terahertz wave, comprising: a carrier generation layer for generating carriers, antennas formed from a conductive material in opposition with a gap on the carrier generation layer, two electrodes containing respectively a strip line formed from a conductive material for controlling a propagation state of the carriers produced in the gap of the antennas, one or more pairs of adjusting stubs for adjusting the state of the generated or detected terahertz wave, wherein the antennas are placed between the strip lines and joined to the strip lines, and the one or more pairs of adjusting stubs include at least first adjusting stubs and second adjusting stubs formed from a conductive material having a stub length of not more than the wavelength λ defined by the interspace between the conductive strip lines, the first adjusting stubs are placed on extension of the strip lines and having the tip ends at a distance of not more than the wavelength λ from the joint between the antenna and the electrode, and the second adjusting stubs are joined to the outside edges of the strip lines at a distance of not more than the wavelength λ from the joint between the antenna and the electrode.

The wavelength λ can be twice the interspace d between the strip lines.

The present invention is directed to an imaging apparatus comprising: The above photoconductive element, an ultrashort pulse laser for generating carriers by applying a generating power to the gap of the antenna, a driver connected to the electrode for controlling a carrier propagation state, whereby information on an inside structure of a measurement object is obtained by generating a terahertz wave by the photoconductive element and receiving a reflected terahertz wave reflected at the surface layer and a refractive index interface inside.

The present invention is directed to a communication apparatus comprising. The above photoconductive element, an ultrashort pulse laser for generating carriers by applying a generating power, a driver connected to the electrode for controlling a carrier propagation state of the generated carriers, and a modulator for modulating a signal input to the electrodes by the driver or an output from the ultrashort pulse laser in accordance with the transmitted information; whereby communication is conducted by use of a terahertz wave having a frequency characteristic localized to reduce a terahertz wave component in the characteristic absorption wavelength band of the atmospheric air in the frequency band of the terahertz wave.

The photoconductive element of the present invention has the adjusting stubs provided on the electrode for adjustment of propagation state, especially the frequency characteristics, of the terahertz wave generated or detected by the carriers.

Further, the adjusting stubs enables generation of a terahertz wave having frequency characteristics suitable for application of the photoconductive element.

Further features of the present invention will become apparent from the following description of exemplary embodiments with reference to the attached drawings.

DESCRIPTION OF THE EMBODIMENTS

Figure 1:
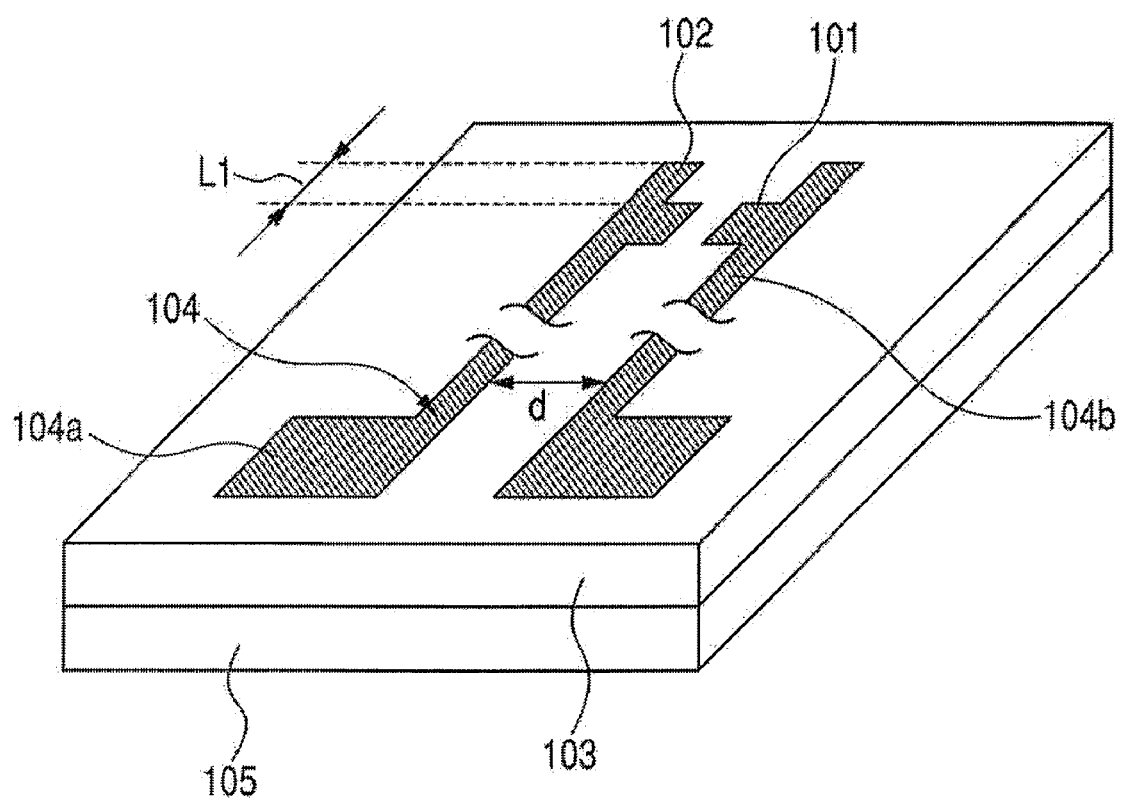
FIG. 1 illustrates schematically a constitution of an example of the photoconductive element.

Embodiments of the present invention will be described with reference to drawings. The present invention is not limited in any way by the embodiments within the gist of the present invention.

In this specification, the term "terahertz wave" denotes an electromagnetic wave occupying any portion of the frequency band ranging from 0.03 THz to 30 THz.

A photoconductive element is described which is employed for generating or detecting a terahertz wave in the embodiment of the present invention.

The photoconductive element of the embodiment comprises a carrier generation layer which generates carriers on light irradiation. The carrier generation layer may be formed from low-temperature-grown gallium-arsenic (LT-GaAs) or indium-gallium-arsenic (InGaAs).

The photoconductive element of this embodiment comprises a pair of electrodes including counterposed strip lines. The electrodes are formed from a conductive material on one face of the carrier generation layer (face to be irradiated). The strip line has, for example, a breadth of 10 μm, and an interspace between the strip lines is 30 μm. In this specification, the interspace d between the strip lines is called also an antenna length. With this element, a terahertz wave is generated which has a wavelength λ of twice the antenna length (λ=2d).

The photoconductive element of this embodiment has two antennas placed in opposition with a gap for irradiating the carrier generation layer. The antennas are formed of a conductive material and are connected respectively to the electrodes. The gap may be selected, for example, to be 5 μm. The gap size is preferably sufficiently large for irradiation of the carrier generation layer, and is preferably sufficiently small for acceleration of the carrier generated in the carrier generation layer by application of a voltage to the electrodes.

The photoconductive element of this embodiment has two adjusting stubs for adjusting the propagation state of the terahertz wave generated or detected by the carriers. The adjusting stubs are made of a conductive material and are connected respectively to the two electrodes. The adjusting stubs have respectively a length of not more than the wavelength λ of the terahertz wave generated by the carriers, and are placed within the distance of wavelength λ from the joint between the antenna and the electrode.

The propagation state of the terahertz wave in the frequency band can be adjusted by changing the length or placement of the adjusting stubs for the leveling or localization. The leveling and the localization are defined as below in this specification. The leveling is a procedure to make even the frequency characteristic of the terahertz wave in the range between the maximum to the attenuation by −3 dB of the terahertz wave intensity. The localizing is a procedure to make the frequency characteristics of the terahertz wave to concentrate at a certain frequency band region.

The length and placement of the adjusting stubs are selected as below for control of the propagation state.

(First and Second Adjusting Stubs)

The present invention relates to a method for adjusting a frequency characteristic of a photoconductive element for generating or detecting a terahertz wave. Specifically, adjusting stubs are attached additionally to the electrodes (including an antenna structure and control electrodes) constituting the photoconductive element for adjusting the frequency characteristic of the photoconductive element. The adjusting stubs include at least one pair of a first adjusting stub pair (stubs 2606 in FIG. 26 and stubs 2806 in FIG. 28) and a second adjusting stub pair (stubs 2506 in FIG. 25 and stubs 2706 in FIG. 27). The first adjusting stubs stretch respectively on the extension end of the strip line as described later in Example 1. The front end of the stub is positioned at a distance corresponding to the wavelength λ or less from the joint between the antenna and the electrode as described later in Example 1, at distance 2027 indicated in FIG. 27. On the other hand, the second adjusting stubs, as described later in Example 3, are connected respectively to the outside edges of the conductive strip lines at a distance of the wavelength λ or less from the joint between the antenna and the electrode. For use of the photoconductive element as a generating element, a terahertz wave suitable for an intended use can be obtained by adjusting the frequency energy distribution of the generated terahertz wave.

The first and second adjusting stubs are described below in detail.

(a) First Adjusting Stubs

Figure 28:
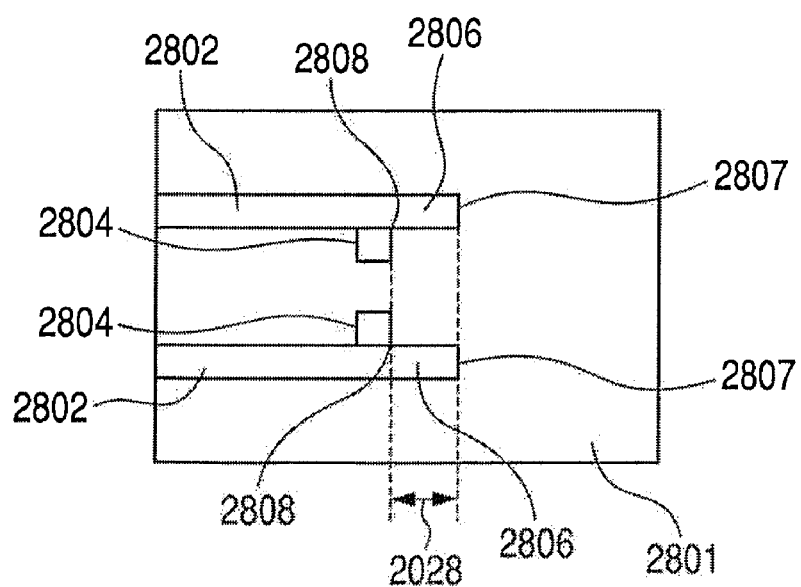
FIG. 28 illustrates a constitution of an embodiment (first adjusting stubs) of the photoconductive element.

A photoconductive element for generating or detecting a terahertz wave of this embodiment is described with reference to FIG. 28.

Carrier generation layer 2801 generates carriers on light irradiation. Two electrodes 2802 contain respectively counterposed strip lines. Electrodes 2802 are formed from a conductive material on the one face (face to be irradiated) of carrier generation layer 2801. Two antennas 2804 are counterposed with a gap for light irradiation onto carrier generation layer 2801. Antennas 2804 are formed from a conductive material in contact with the aforementioned electrodes 2802. A pair of adjusting stubs 2806 are provided for adjusting the propagation state of the terahertz wave generated or detected by the carrier. Adjusting stubs 2806 are formed from a conductive material respectively in contact with electrodes 2802, having respectively a length corresponding to the wavelength λ or less of the terahertz wave to be generated or detected by the carriers. The wavelength λ is twice the dimension of interspace d between the two strip lines (electrodes) 2802. Two adjusting stubs 2806 are respectively joined to the extension ends of the strip lines (electrodes 2802). End 2807 of the adjusting stub is placed at a distance 2028 equivalent to the wavelength λ or less from joint 2808 between antenna 2804 and electrode 2802.

(a-1) Leveling

The constitution for leveling of the frequency characteristic of the terahertz wave generated or detected by the carriers is described below with reference to the photoconductive element of another embodiment of the present invention. Two adjusting stubs 2806 are respectively joined to the lengthwise ends of the strip lines (electrodes 2802). The lengths of adjusting stubs 2806 range from 0.5λ to 0.8λ from joint 2808 between antenna 2804 and electrode 2802. The process of leveling with the adjusting stubs having the above-mentioned length will be described in detail in Example 1.

(a-2) Localization

The constitution for localizing the frequency characteristic of the terahertz wave generated or detected by the carriers is described below with reference to the photoconductive element of another embodiment of the present invention.

Two adjusting stubs 2806 are respectively joined to the extension ends of the strip lines (electrodes 2802). The length of each adjusting stub 2806 ranges from 0.1λ to 0.5λ from joint 2808 between antenna 2804 and electrode 2802. The process of localization by the adjusting stubs having the above-mentioned length will be described in detail in Example 2.

(a-3) Definition by Interspace d between Electrodes

Figure 26:
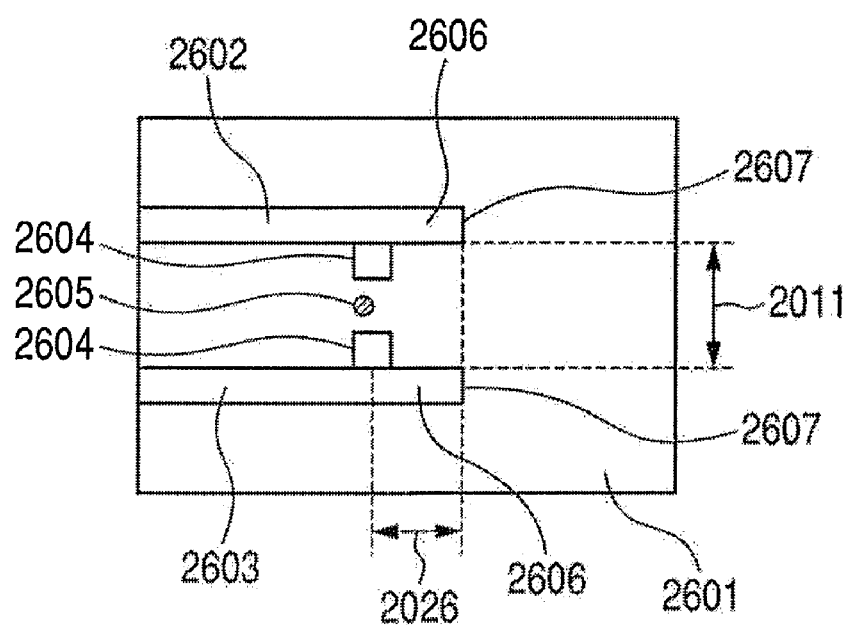
FIG. 26 illustrates a constitution of an embodiment (first adjusting stubs) of the photoconductive element.

The photoconductive element for generating or detecting a terahertz wave of another embodiment of the present invention is described below with reference to FIG. 26. In this embodiment, the length and placement of the first adjusting stubs are defined by the interspace d between the electrodes, whereas in the above embodiments, the length and the placement thereof are defined by the wavelength λ.

Carrier generation layer 2601 generates carriers on irradiation of light. First electrode 2602 is formed on a face of carrier generation layer 2601. Second electrode 2603 is formed on the same face of carrier generation layer 2601 in opposition to first electrode 2602. First electrode 2602 and second electrode 2603 have respectively antenna 2604. Irradiation target spot 2605 to be irradiated by the light is placed between antennas 2604 of first electrode 2602 and second electrode 2603. At least one of the ends 2607 of first electrode 2602 and of second electrode 2603 is placed at a distance 2606 from the irradiation spot 2605 of not longer than twice the interspace d between first electrode 2602 and second electrode 2603.

(b) Second Adjusting Stubs

Figure 27:
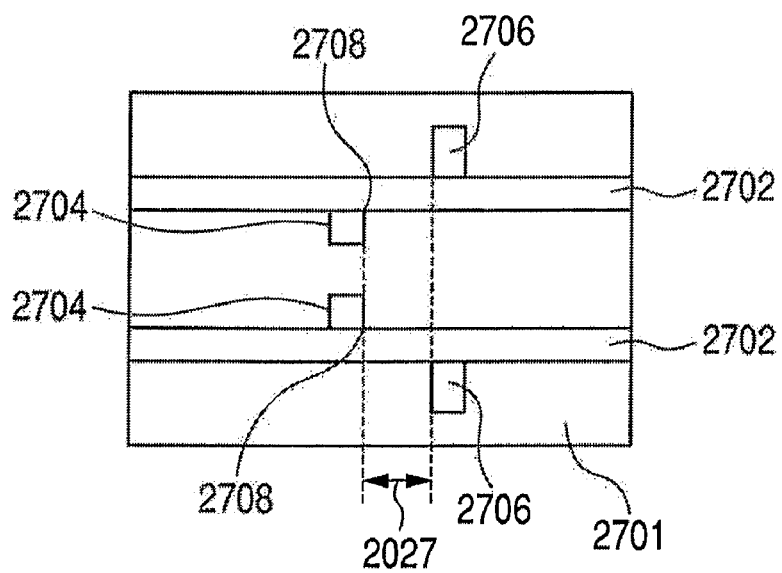
FIG. 27 illustrates a constitution of an embodiment (second adjusting stubs) of the photoconductive element.

The photoconductive element for generating or detecting a terahertz wave of still another embodiment of the present invention is described below with reference to FIG. 27

Carrier generation layer 2701 generates carriers on light irradiation. Two electrodes 2702 contain counterposed strip lines. Electrodes 2702 are formed from a conductive material on the one face of carrier generation layer 2701 (face to be irradiated). Two antennas 2704 are counterposed with a gap for light irradiation onto carrier generation layer 2701. Antennas 2704 are formed from a conductive material in contact with the aforementioned two electrodes 2702. Two adjusting stubs 2706 adjust the propagation state of the terahertz wave generated or detected by the carrier. Two adjusting stubs 2706 are formed from a conductive material respectively in contact with electrodes 2702, having respectively a length of not larger than the wavelength λ of the terahertz wave to be generated or detected by the carriers. Two adjusting stubs 2706 are joined respectively to the outside edges of the conductive strip lines (electrodes) 2702 at a distance of the wavelength λ or less from the joint 2708 between antenna 2704 and electrode 2702.

(b-1) Leveling

The constitution for leveling of the frequency characteristic of the terahertz wave generated or detected by the carriers is described below with the photoconductive element of another embodiment of the present invention.

Two adjusting stubs 2706 respectively have a length ranging from 0.1λ to 0.2λ. These two adjusting stubs 2706 are joined respectively to the outside edge of electrode (strip line) 2702 at a distance equal to the length of the adjusting stubs 2706 from joint 2708 between antenna 2704 and electrodes 2702. The leveling with the above length of the adjusting stubs will be described in detail in EXAMPLE 3.

(b-2) Localization

The constitution for localizing of the frequency characteristics of the terahertz wave generated or detected by the carriers is described below with the photoconductive element of another embodiment of the present invention. Two adjusting stubs 2706 respectively have a length ranging from 0.2λ to 0.5λ, and are joined to the outside edges of electrodes (strip lines) 2702 at a distance equal to the length of the adjustment stubs 2706 from joint 2708 between antenna 2704 and electrode 2702. The leveling with the above length of the adjusting stub will be described in detail in Example 4.

(b-3)

Figure 25:
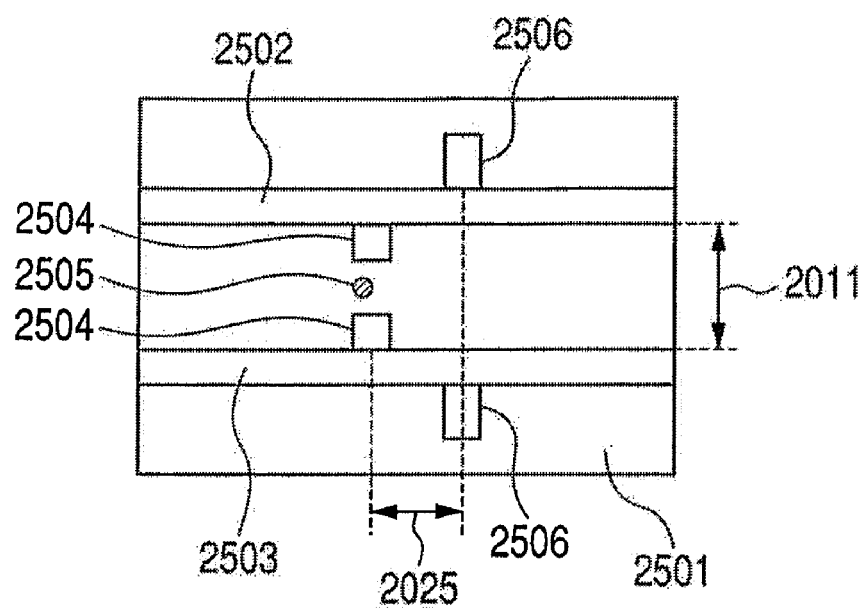
FIG. 25 illustrates a constitution of an embodiment (second adjusting stubs) of the photoconductive element.

Another photoconductive element of this embodiment defined by the electrode interspace d for generating or detecting a terahertz wave is described by reference to FIG. 25. In the above embodiment, the length and position of the first adjusting stubs are defined by the wavelength λ. On the other hand, in this embodiment, the length and position of the first adjusting stubs are defined by electrode interspace 2011 (denoted by a symbol "d").

The photoconductive element has a carrier generation layer 2501 which generates carriers on irradiation of light. Carrier generation layer 2501 is described in detail in Examples below. The photoconductive element has further first electrode 2502 and second electrode 2503 formed in counterposition on carrier generation layer 2501. First electrode 2502 and second electrode 2503 are described in Examples below. Antennas 2504 are joined respectively to first electrode 2502 and second electrode 2503. Antennas 2504 are described also in detail in Examples below.

Irradiation spot 2505 of light irradiation is placed between the antenna of first electrode 2502 and the antenna of second electrode 2503. Adjusting stubs 2506 are joined in opposition to first electrode 2502 and second electrode 2503. Adjusting stubs 2506 are placed at a distance 2025 of not more than twice the electrode interspace d between first electrode 2502 and second electrode 2503 from irradiation spot 2505. The set positions of the adjusting stubs are not limited to that shown in FIG. 25. For example, the adjusting stubs may be placed in a relative position like that shown in FIG. 1. The wavelength λ of the terahertz wave generated or detected by the photoconductive element of the present invention is approximately twice the electrode interspace d.

Adjusting stubs 2506 is described in Examples below.

EXAMPLES

Specific examples of the photoconductive element of the present invention is described with reference to drawings.

Example 1

Leveling of Frequency Characteristic by First Adjusting Stubs

FIG. 1 illustrates the constitution of the photoconductive element of Example 1 of the present invention. This Example describes leveling of a frequency characteristic of the photoconductive element. As illustrated in FIG. 1, the photoconductive element of this Example comprises antennas 101, first adjusting stubs 102 in a pair, carrier generation layer 103, electrodes 104, and substrate 105.

Carrier generation layer 103 generates carriers on irradiation of an exciting light beam to the fine gap of antennas 101. In this Example, carrier generation layer 103 is composed of low-temperature-grown gallium-arsenic (LT-GaAs). Carrier generation layer 103 is formed, for example, on a semi-insulating gallium-arsenic substrate (SI-GaAs) by molecular beam low-temperature epitaxial growth at a growth temperature of 250° C. The material of carrier generation layer 103 is not limited thereto, but may be another semiconductive material such as indium-gallium-arsenic (InGaAs).

Substrate 105 supports carrier generation layer 103. In this Example, the above-described SI-GaAs is employed without treatment as the substrate 105. A plate which is transparent to the terahertz wave may be employed as substrate 105 not to cause undesirable absorption of a terahertz wave by the substrate. An example of the material for substrate 105 is high-resistance silicon (Si). When the high-resistance silicon substrate is employed, the semiconductive substrate used for the growth of carrier generation layer 103 is removed by etching, and the carrier generation layer 103 is fixed on substrate 105 by a bonding means such as an adhesive.

Antennas 101 is formed from a conductive body with a fine gap. The above-mentioned carrier generation layer 103 is placed at least immediately below the fine gap of antennas 101. This portion of antennas 101 decides roughly the operation frequency and frequency characteristics of the photoconductive element. In the photoconductive element, the length of the antennas 101 (equal to the electrode interspace d of electrodes 104) decides the operation frequency $\lambda$ (approximately, $\lambda=2d$), and the breadth and shape of the antennas decides the frequency characteristics.

In this Example, antenna 101 employed is a dipole type antenna structure having a length of 30 µm, a conductive body breadth of 10 µm, and a fine gap of 5 µm. These dimensions and type of the antennas may be changed for desired characteristics of the terahertz wave. The type of the antenna structure may also be changed The dipole antenna constitutes a half-wave resonator. Therefore, the length of the antennas corresponds to half ($\lambda/2$) of the antenna operation wavelength $\lambda$. In this specification, the description is based on the operation wavelength $\lambda$ assumed from the antenna length (equivalent to the electrode interspace d of electrodes 104). However, actual frequency characteristics of the photoconductive element depends not only on the antenna length but also affected by the carrier behavior and substrate properties. Therefore, the frequency characteristics of the actual photoconductive element can be different from the frequency characteristics estimated from the antenna shape.

Electrodes 104 are constituted of strip lines 104b extending parallelly and electrode pads 104a. The electrode pads are utilized for connection with an outside device. At the tip end portions of the strip lines, antennas 101 are formed between the conductive strip lines. Further, as illustrated in FIG. 1, adjusting stubs 102 in a pair are joined to the lengthwise ends of conductive strip lines. In this Example, the breadth of the conductive strip line 104b is 10 µm, and the interspace d between the conductive material is 30 µm. The interspace d between the conductive members corresponds to the length of antenna 101 (approximately, $\lambda/2$).

Such a conductor structure can be formed by collective patterning by a usual process such as vapor deposition. Therefore, the adjusting stubs 102 can be formed relatively simply.

The photoconductive element of this Example, for use as a terahertz wave generating element, electrodes 104 applies a necessary electric field to the gap of antennas 101. The photoconductive element of this Example, for use as a terahertz wave detecting element, electrodes 104 detects signals (specifically, electric current) transmitting between electrodes 104.

Adjusting stubs 102 are used for adjusting a frequency characteristic of the photoconductive element. In this Example, the frequency characteristic is leveled by interference of a part of the terahertz wave transmitted in antennas 101. In this specification, the term "leveling of the frequency characteristic" is defined to increase the distribution range of the terahertz wave. More specifically, in this specification, the term "leveling" signifies distributing the terahertz wave more in a frequency range from the maximum intensity to the decay by −3 dB. In this Example, adjusting stubs 102 are respectively a linear line of a conductive material having a breadth of 10 µm.

As described above, the photoconductive element of this Example comprises carrier generation layer 103, antennas 101, electrodes 104, a pair of adjusting stubs 102. Antennas 101 are formed on carrier generation layer 103 from a conductive material in opposition with a gap. Electrodes 104 include two strip lines 104b constituted of a conductive material, and control the propagation state of the carriers generated at the gap of antennas 101. Adjusting stubs 102 in a pair adjust the state of the terahertz wave generated or detected. Antennas 101 are placed between conductive strip lines 104b and are joined respectively to the strip lines.

Adjusting stubs 102 (first adjusting stubs) in a pair are constituted of a conductive material and have a length L1 not more than the wavelength $\lambda$ which is defined by the length of antenna 101. This first adjusting stubs extend in the length direction of strip lines 104b, and the tip portions are placed at a distance of not longer than the wavelength $\lambda$ from the joints between antenna 101 and electrode 104. The ends of the two conductive strip lines 104b of electrodes 104 at the antenna side are placed at a distance of not more than the wavelength $\lambda$ from the joint between the antennas 101 and electrodes 104.

An operation in this Example is described below. The operation principle is similar to that of a conventional photoconductive element. For use of the photoconductive element of the present invention as a generating element, a necessary electric field is applied to electrodes 104. In this Example, under application of a bias of 10 V, an ultra-short pulse laser beam is projected to the fine gap of antennas 101 at a laser pulse width of 50 fsec and repeating frequency of 76 MHz from a titanium-sapphire laser source. On the projection of the ultra-short pulse to the fine gap of antennas 101, carriers are generated in carrier generation layer 103. The generated carriers are accelerated by the electric field formed by the electrodes 104 to cause dipole radiation for use as the terahertz wave.

For use of the photoconductive element of the present invention as a detecting element, a current detector is connected to electrodes 104. In synchronization with introduction of the terahertz wave to the detecting element, an ultra-short pulse laser beam is projected to the fine gap of antennas 101. Thereby the carriers induced by the terahertz wave in carrier generation layer 103 are detected by a current detector. More specifically, the timing of projection of the ultra-short wave laser beam is delayed successively from the timing of introduction of the terahertz wave, the electric current at the respective timings are plotted to detect the time-waveform of the terahertz wave.

Figure 12:
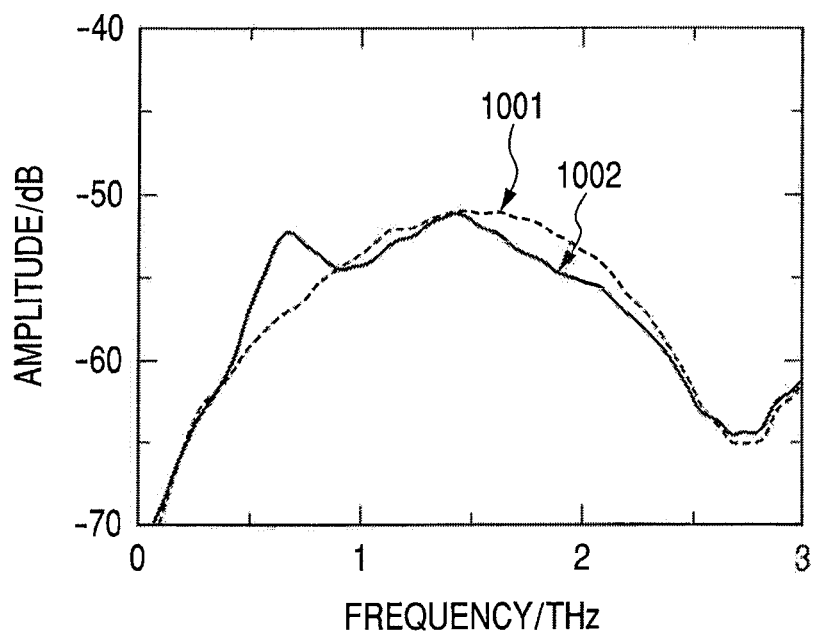
FIG. 12 shows the results of electromagnetic field analysis by the photoconductive element in Example 1.

As described above, adjusting stubs 102 serve for leveling the frequency characteristic of the photoconductive element. FIG. 12 shows electromagnetic field analysis results regarding the effect of adjusting stubs 102. Adjusting stubs 102 have a length L1 of 0.6$\lambda$. In FIG. 12, broken line 1001 shows the frequency characteristic of the photoconductive element without adjusting stubs 102, whereas solid line 1002 shows the frequency characteristic with adjusting stubs 102 joined. When leveling of the frequency characteristic is indicated by the band width at the position of the intensity of −3 dB, the joined adjusting stubs 102 is found to improve the leveling state by a factor of 1.2. In this Example, the length L1 of adjusting stubs 102 is selected to enlarge the band width.

Figure 13:
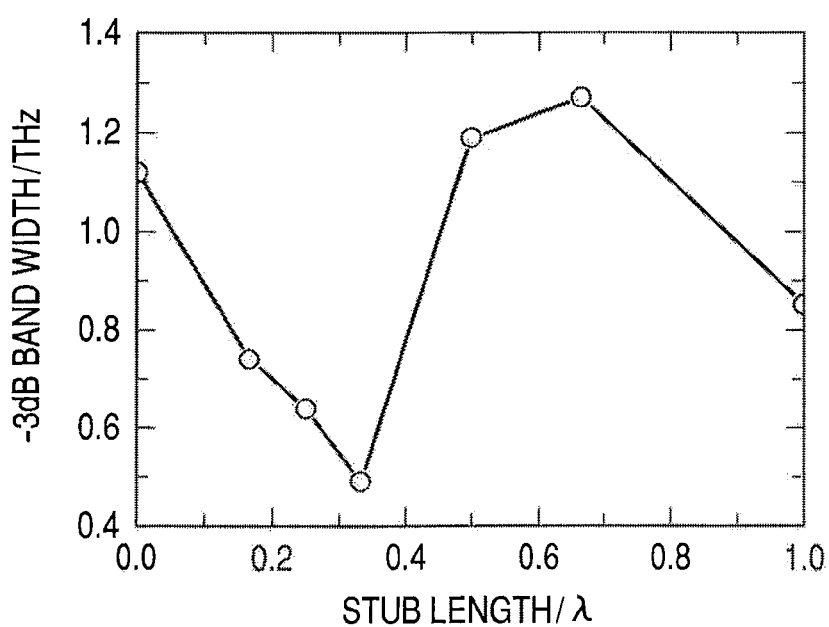
FIG. 13 shows the effect of the adjusting stub of the photoconductive element in Example 1.

FIG. 13 shows dependence of the band width at the intensity of −3 dB on the stub length L1 of adjusting stubs 102 in the stub length range from 0 to λ, where λ of 0 (zero) means absence of adjusting stubs 102. In comparison with this state, the leveling state of the frequency characteristic is improved by adjusting stubs 102 in the range of the stub length L1 from 0.5λ to 0.8λ. Thus in this Example, the frequency characteristic of the photoconductive element is leveled by adjusting stubs 102 connected to the extension ends of the strip lines and having a stub length ranging from 0.5λ to 0.8λ from the joint between the antenna and the electrode.

In this Example, adjusting stub 102 is in a shape of a straight line, but is not limited thereto: the stub may be tapered. The width of the line may be changed depending on the conditions. In principle, any structure of adjusting stub 102 is included in the gist of the present invention, insofar as the adjusting stub is capable of adjusting a frequency characteristic of a photoconductive element.

As described above, the frequency characteristic of the photoconductive element can be adjusted by selecting the length of adjusting stub 102. A terahertz wave having a nearly monocycle shape can readily be obtained by leveling the frequency characteristic.

Japanese Patent No. 3165653 discloses a general circuit technique for adjusting an antenna characteristic by causing interference between electromagnetic waves. However, this patent document teaches use of a stub structure in a so-called Yagi-Uda antenna, but teaches or suggests nothing about the terahertz wave. The patent document teaches or suggests nothing about the photoconductive elements for generating or detecting the terahertz wave or an antenna joined to an electrode deposited on a layer for generating carriers.

The propagation characteristic of the terahertz wave in a photoconductive element depends on the propagation state of carriers as well as the antenna structure as described above. Here, the propagation state of the carriers includes the behavior of carriers, influence of the members employed (e.g., absorption of phonons characteristic to a semiconductor substrate), and so forth. Therefore, simple application of conventional circuit control technique (an antenna technique or a distributed constant circuit technique) to a terahertz wave technique does not give an intended propagation state. The adjusting stub of the present invention is designed for application to a terahertz wave technique, and solves the problem inherent to terahertz wave for controlling the carrier propagation state of carriers. Therefore, the present invention is not simple diversion of a known radio wave antenna to a conventional photoconductive element.

Example 2

Localization of Frequency Characteristic by First Adjusting Stubs

This Example employs a photoconductive element having the same basic structure as in Example 1, but the photoconductive element localizes a frequency characteristic other than that in Example 1. The matters common to Example 1 are not described redundantly.

FIG. 1 illustrates the constitution of the photoconductive element of Example 2 of the present invention. This Example is different from Example 1 in the length L1 of adjusting stub 102.

Figure 14:
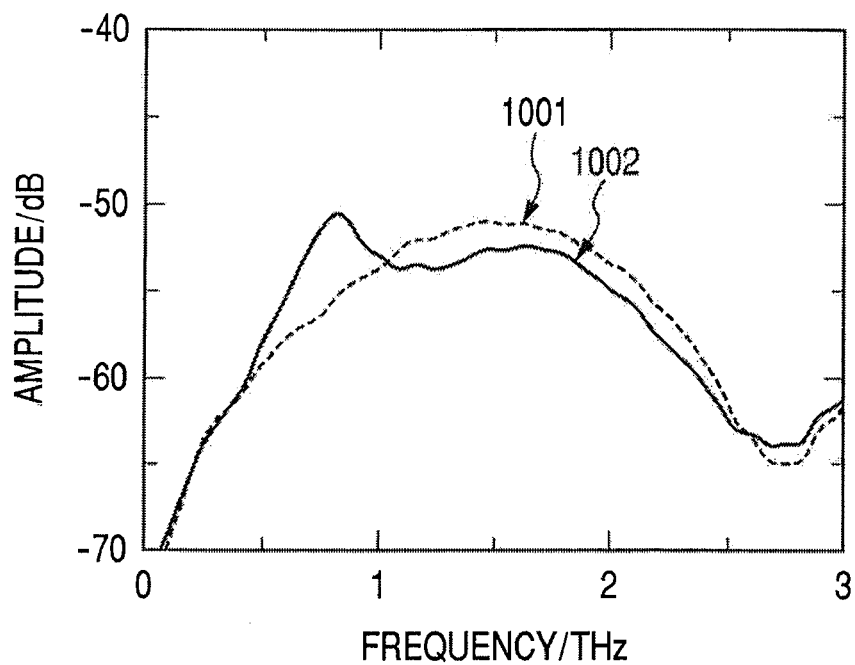
FIG. 14 shows the results of electromagnetic field analysis by the photoconductive element in Example 2.

FIG. 14 shows electromagnetic field analysis results illustrating the effect of adjusting stubs 102. Adjusting stubs 102 in FIG. 14 in this Example have a length L1 of 0.5λ. In FIG. 14, broken line 1001 shows the frequency characteristic of the photoconductive element without adjusting stubs 102, whereas solid line 1002 shows the characteristic with adjusting stubs 102 joined. In this specification, the localization of the frequency characteristic signifies a state of concentration of the intensity in a certain frequency band from a nearly flat distribution of an intensity of frequency characteristic. For example, in FIG. 14, the intensity is high around 0.8 THz owing to the presence of adjusting stubs 102.

Figure 15:
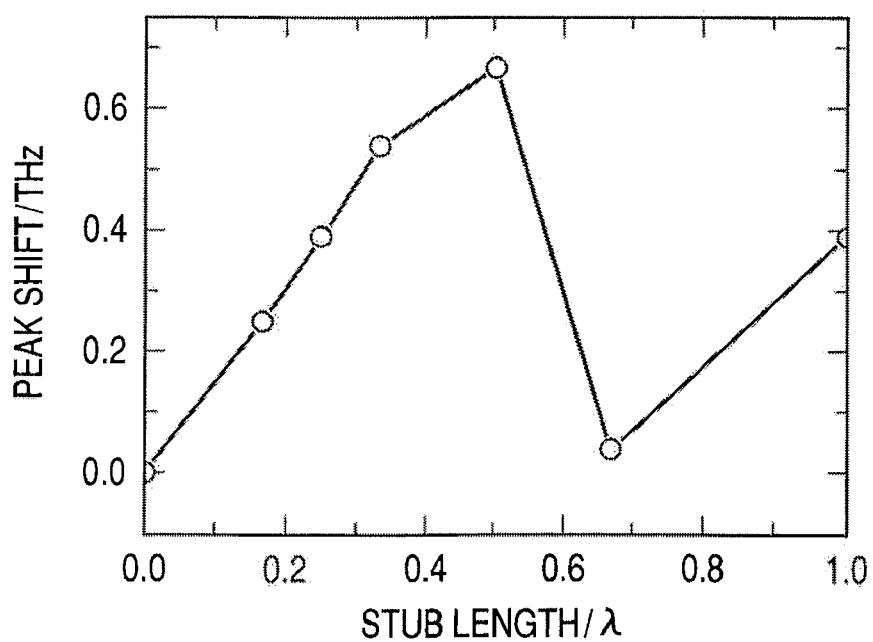
FIG. 15 shows the effect of the adjusting stub of the photoconductive element in Example 2.

FIG. 15 shows shift of the peak frequency of the intensity distribution owing to the presence of adjusting stubs 102 from the peak frequency without adjusting stubs 102 (corresponding to the broken line 1001 in FIG. 14). FIG. 15 shows that the frequency shift increases linearly in the range of the length of adjusting stubs 102 from 0λ to 0.5λ. In this Example also, the adjusting stubs 102 are patterned by a vapor deposition process. From the precision of the micro-order processing, the working precision is estimated to be 0.01λ. In consideration of this error, the frequency characteristics of the photoconductive element can be adjusted precisely in the range of the stub length from 0.1λ to 0.5λ. Thus in this Example, adjusting stubs 102 are joined respectively to the extension ends of the strip lines and have a length ranging from 0.1λ to 0.5λ from joints between the antenna and electrode, and localize the frequency characteristic of the photoconductive element.

In this Example also, adjusting stub 102 is in a shape of a straight line, but is not limited thereto: the stub may be tapered. The width of the line may be changed depending on the conditions. In principle, any structure of adjusting stub 102 is included in the gist of the present invention, insofar as adjusting stubs 102 are capable of adjusting a frequency characteristic of a photoconductive element.

Figure 21:
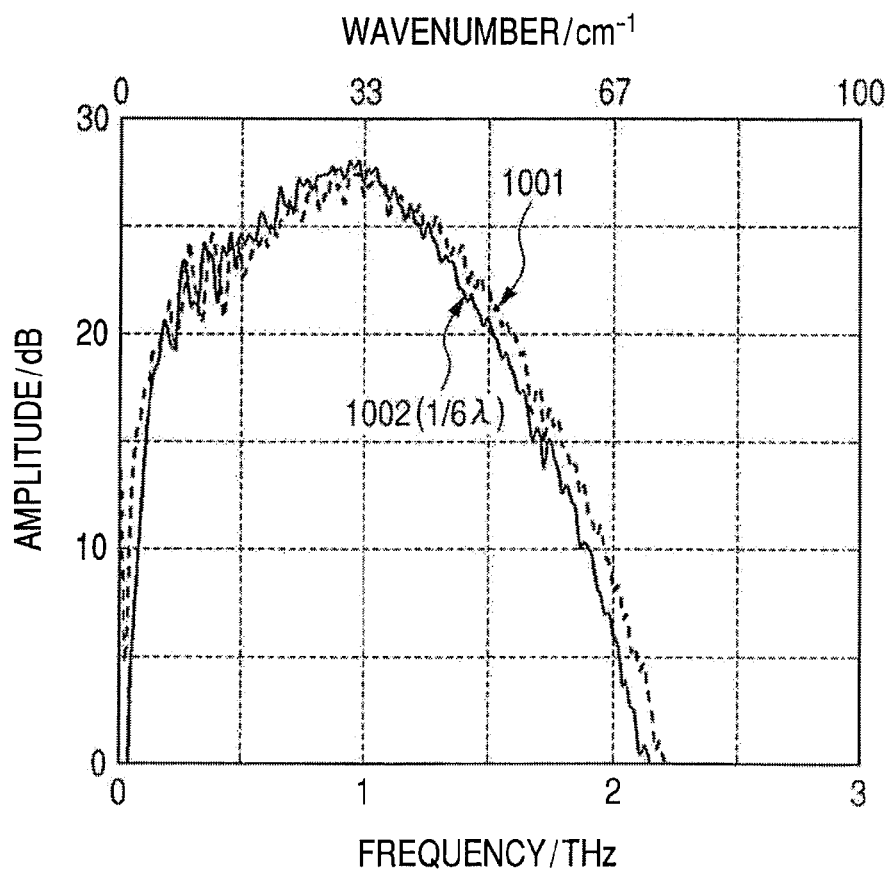
FIG. 21 shows the measurement results by the photoconductive element in Example 2.

FIG. 21 shows the results of measurement with the photoconductive element of this Example. In this measurement, carrier generation layer 103 is a plate of LT-GaAs of 2 μm thick. Substrate 105 is an SI—GaAs substrate. Antennas 101 are a dipole type antenna structure, having an antenna length of 30 μm and a conductive body breadth of 10 μm. Antennas 101 have a fine gap of 5 μm therebetween. Strip line 104b constituting electrode 104 has a length of 2 mm. Electrode pad 104a of electrode 104 has a size of 500 μm×500 μm. Adjusting stub 102 has a length L1 of 10 μm. Since the antenna length is 30 μm, the stub length L1 corresponds approximately to 0.15λ.

In the measurement in FIG. 21, the above photoconductive element is employed as the terahertz wave-generating element (the results shown by solid line 1002). For comparison, the same photoconductive element without the adjusting stubs is employed as a terahertz wave detecting element. Further, in FIG. 21, to confirm the effect of adjusting stubs 102, a photoconductive element having the same terahertz wave-detecting element having no adjusting stub 102 is employed as a terahertz wave-generating element (the results being shown by broken line 1001). FIG. 21 shows that the intensity is decreased at the frequency higher than 1.2 THz, whereas the intensity is increased in the frequency range from 0.5 THz to 1.0 THz. FIG. 14 shows the results at the stub length L1 of 0.5λ, the tendency being similar to that in FIG. 21. FIG. 15 shows that, at the stub length L1 of 0.16λ, the frequency characteristic is shifted to the lower frequency side by about 0.15 THz. FIG. 21 shows that the prepared photoconductive element has the frequency characteristic shifted at the same order as above to the lower frequency side.

As described above, the frequency characteristic of the photoconductive element can readily be adjusted by selecting the length of adjusting stubs 102. Highly efficient transmission of a terahertz wave can be realized by avoiding, for example, the characteristic absorption spot of water vapor by selecting the structure of adjusting stubs 102 as well as the size and structure of antennas 101.

Example 3

Leveling of Frequency Characteristic by Second Adjusting Stubs

Figure 2:
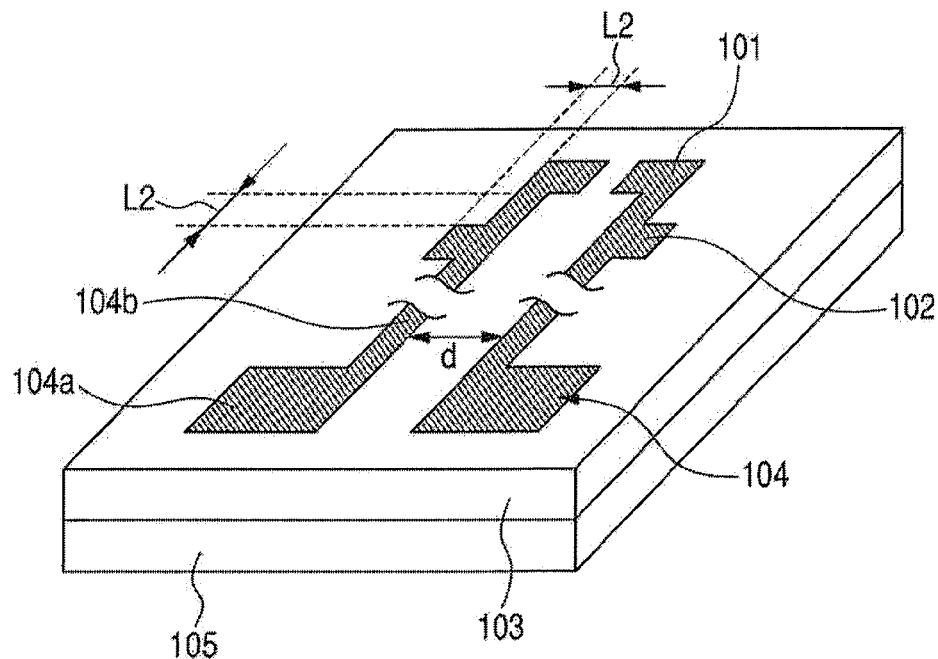
FIG. 2 illustrates schematically a constitution of another example of the photoconductive element.

FIG. 2 illustrates the constitution of the photoconductive element of Example 3 of the present invention. This Example describes leveling of the frequency characteristic of the photoconductive element. The matters common to the above Examples are not described redundantly. This Example is different from the above Examples in the joint position of adjusting stubs 202. Adjusting stubs 202 in a pair are joined respectively to outside edges of the two conductive strip lines at a distance L2 from the joint between the antenna and the strip line. The length of adjusting stub 202 is also L2, the same as the distance from the joint.

In short, the photoconductive element of this Example comprises carrier generation layer 103, antennas 101, electrodes 104, and one or more pairs of adjusting stubs 202. Antennas 101 are formed from a conductive material in opposition with a gap therebetween on carrier generation layer 103. Two electrodes 104 have conductive strip lines 104b, and control the propagation state of the carriers generated at the gap of antennas 101. Adjusting stubs 202 in a pair adjust the state of the generated or detected terahertz wave. Antennas 101 are joined respectively to the inside of two conductive strip lines 104b.

Adjusting stubs 202 (second adjusting stubs in a pair) constituted of a conductive material and have a length of not more than the wavelength λ defined by the length of antennas 101 (distance d between electrodes 104). The second adjusting stubs are joined to outside edges of two conductive strip lines 104b at a distance of not more than λ from the joint between the antenna and the electrode. The end of the conductive strip line 104b at the antenna side is at a distance of not larger than the wavelength λ from the joint between the antenna and the electrode.

Figure 16:
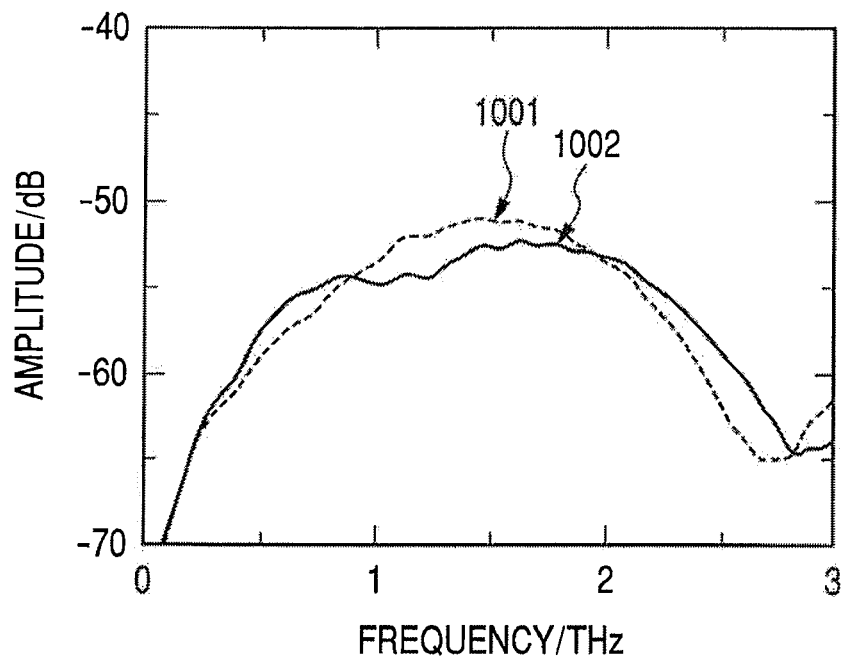
FIG. 16 shows the results of electromagnetic field analysis by the photoconductive element in Example 3.

FIG. 16 shows electromagnetic field analysis results regarding the effect of adjusting stubs 202. Adjusting stubs 202 are joined at a distance L2 of 0.15λ and have a length L2 of 0.15λ. In FIG. 16, broken line 1001 shows the frequency characteristic of the photoconductive element without adjusting stubs 202, whereas solid line 1002 shows the frequency characteristic with adjusting stubs 202 joined. When leveling of the frequency characteristic is indicated by the band width at the position of the intensity of −3 dB similarly as in Example 1, the joined adjusting stubs 202 is found to improve the leveling state by a factor of about 1.4. In this Example also, the length L2 and joining position L2 of adjusting stubs 202 are selected to expand the band width.

Figure 17:
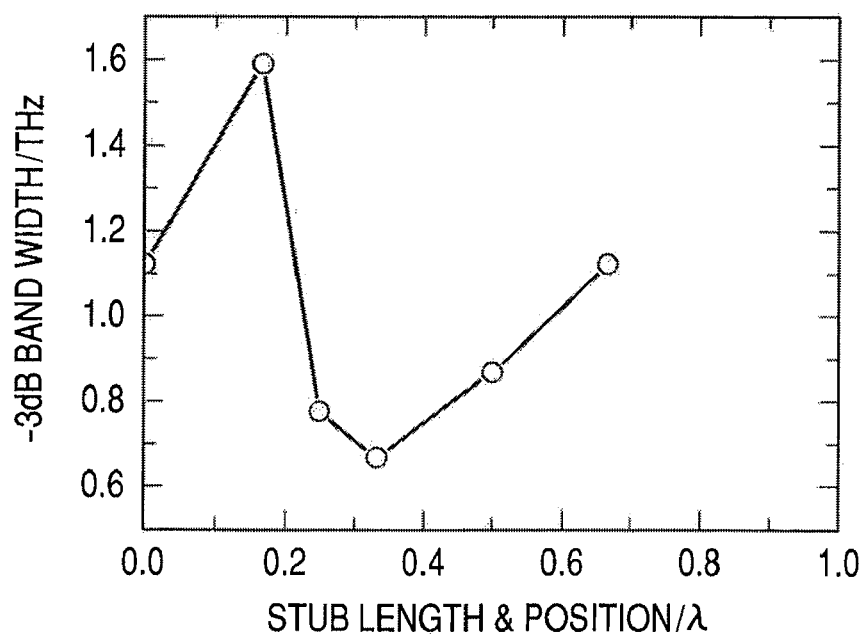
FIG. 17 shows the effect of the adjusting stub of the photoconductive element in Example 3.

FIG. 17 shows dependence of the band width at the intensity of −3 dB on the stub length and joint position L2 of adjusting stubs 202. In FIG. 17, λ of 0 (zero) means absence of adjusting stubs 102, similarly as in Example 1. In comparison with this state, the leveling state of the frequency characteristic is improved by selecting the stub length and joint position L2 of adjusting stubs 202 to be not more than 0.2λ. In this Example also, adjusting stubs 202 are patterned by a vapor deposition process. The process error is converted to be an order of 0.01λ for processing precision of a micro-order. In consideration of this error, the frequency characteristics of the photoconductive element can be adjusted precisely in the range of L2 from 0.1λ to 0.2λ. Thus in this Example, second adjusting stubs 202 have a length ranging from 0.1λ to 0.2λ, and are joined respectively to the outside edge of the conductive strip lines 104b at a distance corresponding to the length of adjusting stubs 202 from the joint between the antenna and the electrode to level the frequency characteristic of the photoconductive element.

In this Example also, adjusting stub 202 is in a shape of a straight line, but is not limited thereto: the stub may be tapered. The width of the line may be changed depending on the conditions.

Further, in this Example, the length of adjusting stub 202 and the distance between the stub and the joint are made equal to each other, but is not limited thereto. In principle, any structure of adjusting stub 202 is included in the gist of the present invention, insofar as the adjusting stubs are capable of adjusting a frequency characteristic of a photoconductive element.

Figure 22:
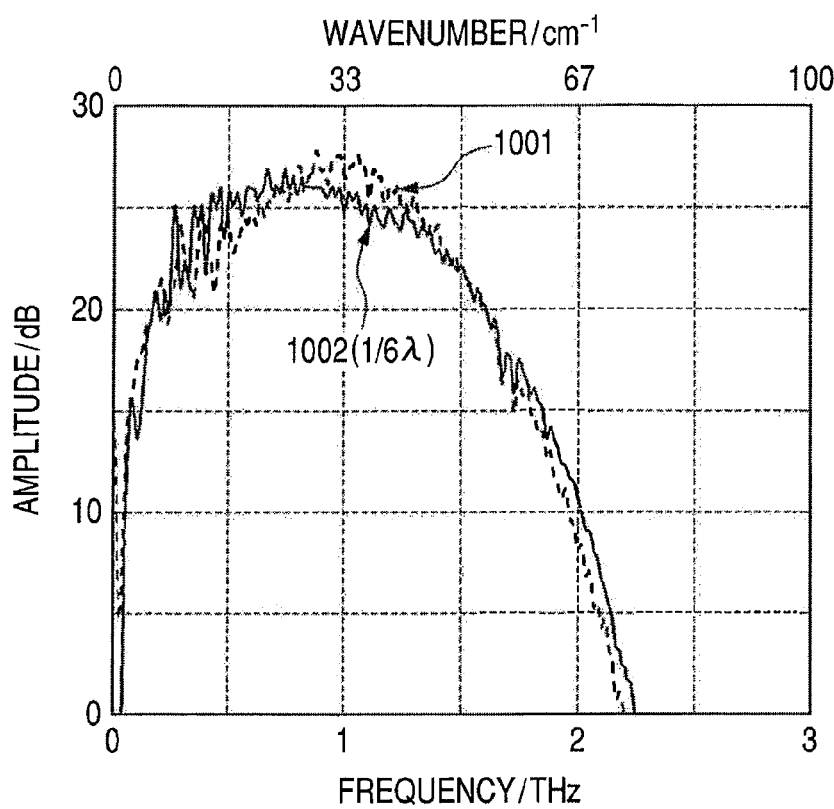
FIG. 22 shows the measurement results by the photoconductive element in Example 3.

FIG. 22 shows the results of measurement with the photoconductive element of this Example. In this measurement, carrier generation layer 103 is a plate of LT-GaAs of 2 μm thick. Substrate 105 is an SI—GaAs substrate. Antennas 101 are a dipole type antenna structure, having an antenna length of 30 μm and a conductive body breadth of 10 μm. Antennas 101 have a fine gap of 5 μm. Strip line 104b constituting electrode 104 has a length of 2 mm. Electrode pad 104a of electrode 104 has a size of 500 μm×500 μm. Adjusting stub 202 has a length L2 of 10 μm and placed at the joint position L2 of 10 μm. Since the antenna length is 30 μm, the stub length L2 and the joint position L2 correspond approximately to 0.15λ.

Figure 23:
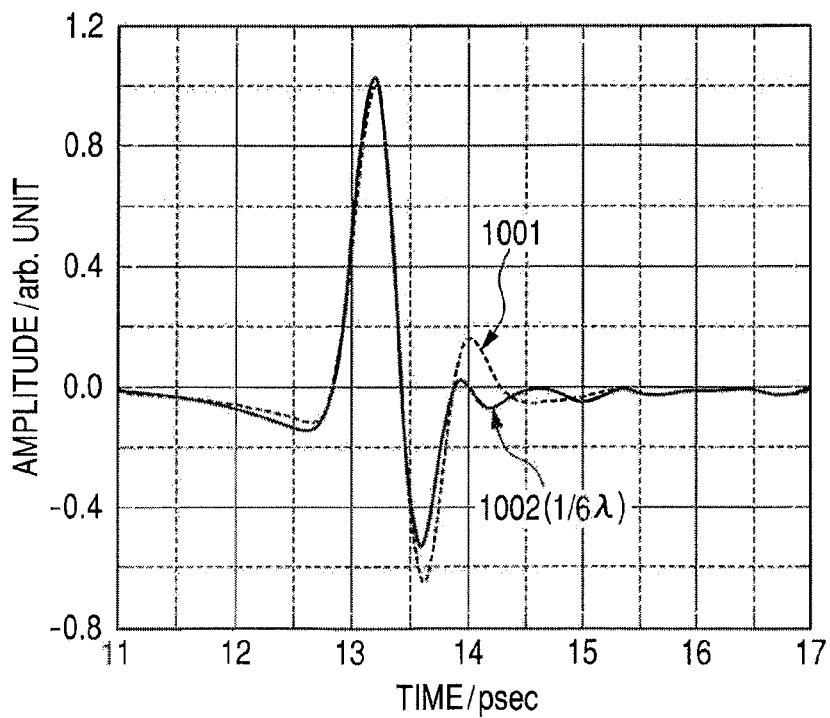
FIG. 23 shows the measurement results by the photoconductive element in Example 3.

The photoconductive element employed in the analysis in FIG. 22 has the same constitution as the one in FIG. 16. Regarding the band width at the intensity of −3 dB, the band characteristic in FIG. 22 is improved in the leveling state by a factor of about 1.5. The measurement result has similar tendency as the analysis result. FIG. 23 shows measured waveforms of the terahertz wave generated in the photoconductive element in the measurement of FIG. 22 as a function of time. As described above, adjusting stubs 202 improves the leveling of the frequency characteristic, giving a nearly monocyclic terahertz wave.

As described above, the frequency characteristic of the photoconductive element can readily be adjusted by selecting the length of second adjusting stub 202. A terahertz wave having a nearly monocycle shape can readily be obtained by leveling the frequency characteristic.

Example 4

Localization of Frequency Characteristic by Second Adjusting Stubs

This Example employs a photoconductive element having the same basic structure as in Example 3, but the photoconductive element localizes a frequency characteristic similarly as in Example 2. The matters common to above Examples are not described redundantly.

FIG. 2 illustrates the constitution of the photoconductive element of Example 4 of the present invention. This Example 4 is different from Example 3 in the length and joint position of adjusting stubs 202.

Figure 18:
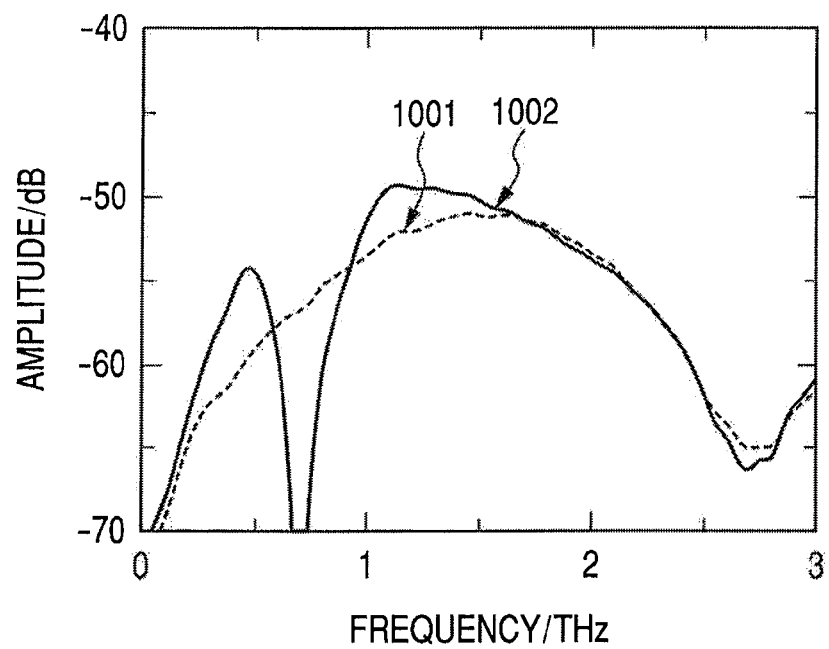
FIG. 18 shows the results of electromagnetic field analysis by the photoconductive element in Example 4.

FIG. 18 shows electromagnetic field analysis results, denoting the effect of adjusting stubs 202. The length and joint position L2 of adjusting stubs 202 is 0.5λ respectively. In FIG. 18, broken line 1001 illustrates the frequency characteristic of the photoconductive element without adjusting stubs 202, whereas solid line 1002 illustrates the characteristic with adjusting stubs 202 joined. In this specification, the term "localization of the frequency characteristic" signifies a state of concentration of the intensity in a certain frequency band from a nearly leveled distribution of an intensity of frequency characteristic, similarly to that defined in Example 2. For example, in FIG. 18, the intensity is low around 0.7 THz and high around 0.4 THz owing to the presence of adjusting stubs 202.

Figure 19:
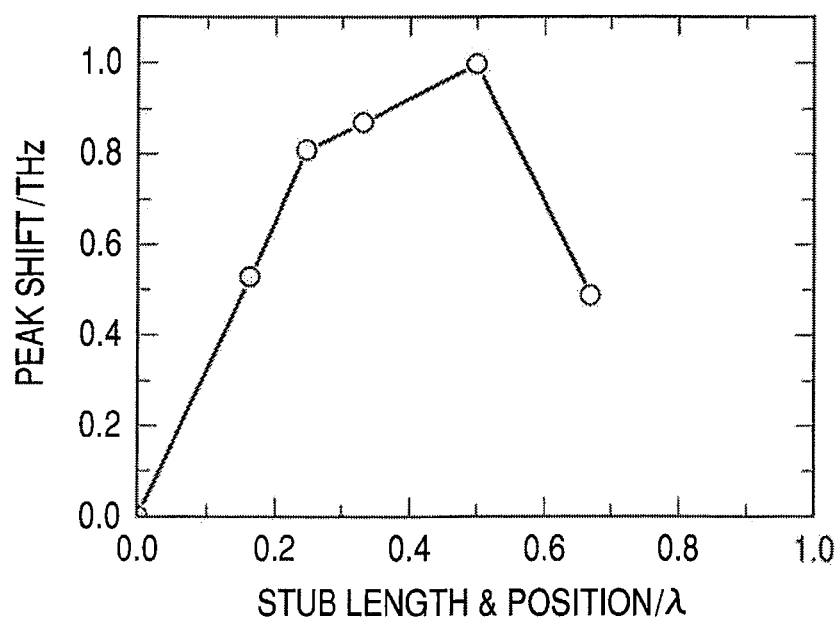
FIG. 19 shows the effect of the adjusting stub of the photoconductive element in Example 4.

FIG. 19 shows shift of the peak frequency of the intensity distribution owing to the presence of adjusting stubs 202 from the peak frequency without adjusting stubs 202 (corresponding to the broken line 1001 in FIG. 18). FIG. 19 shows that the frequency shift increases linearly in the range of the length and joint position of adjusting stubs 202 from 0λ to 0.5λ. As described in Example 3, in the range up to L2 of 0.2λ, adjusting stubs 202 contribute greatly the leveling of the frequency characteristic. Therefore in this Example, the region for precise adjustment of the characteristic of the photoconductive element is defined to be in the range of L2 from 0.2λ to 0.5λ. That is, in this Example, second adjusting stubs 202 have a length ranging from 0.2λ to 0.5λ, and are joined to the outside edges of two conductive strip lines 104b at a distance equivalent to the length of adjusting stubs 202 from the joint between the antenna and the electrode position to localize the frequency characteristic of the photoconductive element.

In this Example also, adjusting stub 202 is in a shape of a straight line, but is not limited thereto: the stub may be tapered. The width of the line may be changed depending on the conditions. In principle, any structure of adjusting stub 202 is included in the gist of the present invention, insofar as adjusting stubs 202 are capable of adjusting a frequency characteristic of a photoconductive element As described above, the frequency characteristic of the photoconductive element can readily be adjusted by selecting the length and joint position of adjusting stubs 202. Highly efficient transmission of a terahertz wave can be achieved by localizing the frequency characteristic, for example, in a band width where the terahertz wave is absorbed less by the atmospheric air (atmospheric window) by selecting the size and structure of antennas 101 and the structure of adjusting stubs 202.

First adjusting stubs 102 and second adjusting stubs 202 as described in the above Examples may be employed in combination, if necessary.

Example 5

Imaging Apparatus

This Example describes a constitution of an apparatus for practicing the present invention. Specifically, this example describes a constitution of an imaging apparatus for obtaining information in the depth direction of a sample by using the photoconductive element described above. The matters common to the above Examples are not described redundantly.

Figure 3:
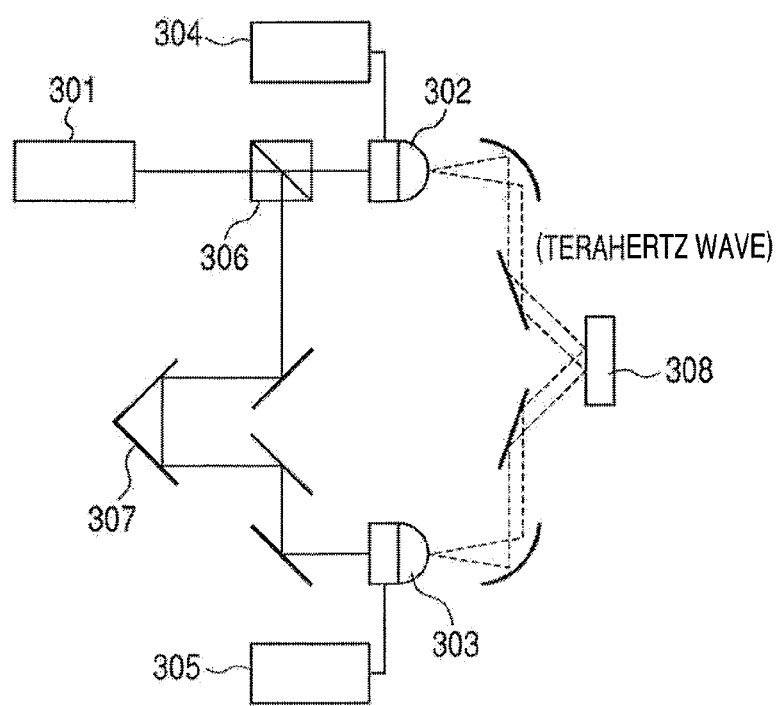
FIG. 3 illustrates a constitution of an imaging apparatus employing the photoconductive element.

FIG. 3 illustrates schematically a constitution of an imaging apparatus in this Example. As illustrated in FIG. 3, the imaging apparatus comprises fiber laser 301, photoconductive element 302 for generation, photoconductive element 303 for detection, driver 304, detector 305, beam splitter 306, and delaying section 307. This imaging apparatus constructs a reflecting optical system for sample 308, and obtains information in the depth direction of sample 308 as illustrated in FIG. 3. The optical system may be of a transmission type although the reflecting system is employed in this Example.

Figure 20:
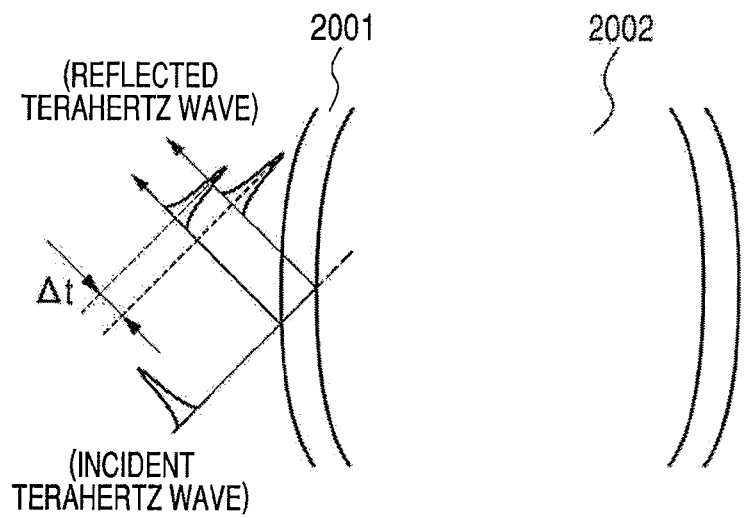
FIG. 20 illustrates an application to an imaging apparatus.

For example, when a tablet is used as a sample 308 as illustrated in FIG. 20, the terahertz wave introduced to the tablet is reflected by the surface of coating film 2001 and at the interface between coating film 2001 and medicine portion 2002. The relative time delay Δt and change of the waveform of the respective reflected terahertz waves monitored give information on the film thickness of coating film 2001, the properties of medicine 2002, and so forth. For precise detection, preferably the respective reflected terahertz waves are preferably separated temporally, and interfere less. For this purpose, the terahertz wave employed has preferably a waveform having a small pulse width near to a monocycle in the shape.

The terahertz wave generated by photoconductive element 302 is affected by the properties of the exciting light beam from fiber laser 301 and characteristics of photoconductive element 302 itself. The reflected terahertz waves can readily be separated when the exciting light beam has a small pulse width in a nearly monocycle shape and photoconductive element 302 has broad-band frequency characteristics.

Figure 4:
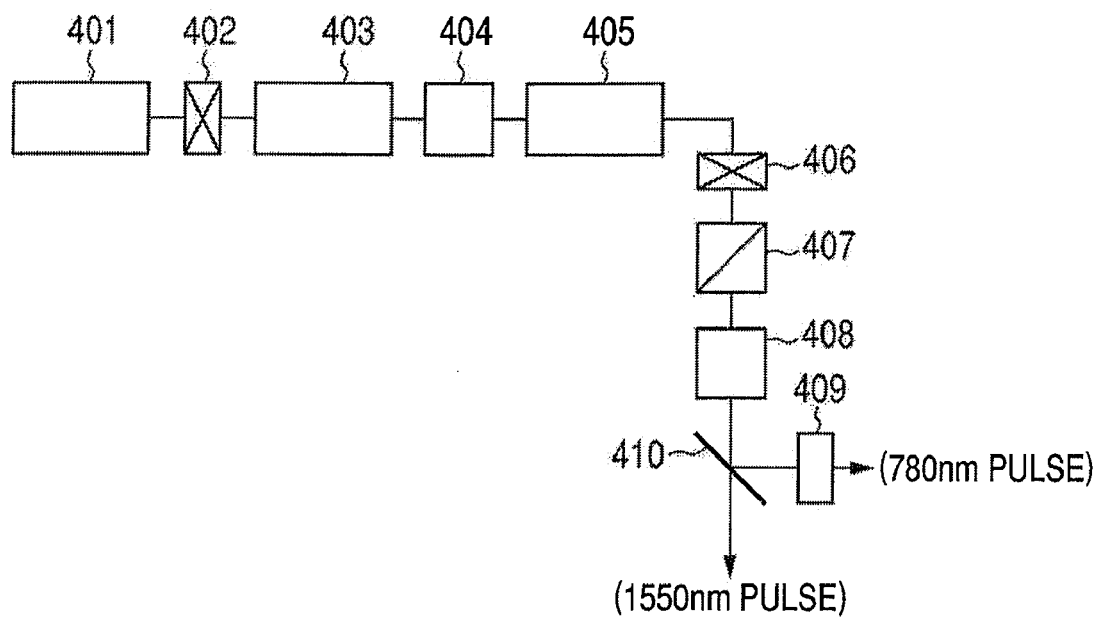
FIG. 4 illustrates a constitution of a fiber laser.

Fiber laser 301 is a small and stable ultra-short pulse laser source constituted of an optical fiber. FIG. 4 illustrates a constitution of fiber laser 301. As illustrated in FIG. 4, fiber laser 301 is constituted of femto-second fiber laser 401, half-wave plates 402 and 406, amplifier section 403, isolator 404, dispersion compensator 405, polarization beam splitter 407, PPLN 408, green-cut filter 409, and dichroic mirror 410. The term "PPLN" is abbreviation of Periodically-Poled-Lithium-Niobate which is a high-efficiency wavelength-conversion element. Femto-second fiber laser 401 employs an optical fiber as the oscillation medium of the laser, having a center wavelength 1558 nm, an average intensity 5 mW, a pulse width 300 fsec, and a repeating frequency 48 MHz. Such a fiber type femto-second fiber laser 401 is small and stable in comparison with a solid laser.

Half-wave plates 402 and 406 are used for regulating the polarized light. Amplifier section 403 amplifies the light pulse intensity from femto-second fiber laser 401. The pulsed light beam having the intensity amplified by amplifier section 403 is short-pulsed by dispersion compensation section 405. PPLN 408 generates, from the short-pulsed light beam, a secondary higher harmonics component at 780 nm. The beam is allowed to pass through green-cut filter 409 and dichroic mirror 410. Thereby the higher harmonics component of 780 nm is output at a desired branching ratio with the reference wave component 1550 nm. This higher harmonics wave component corresponds to absorption wavelength of LT-GaAs, and is used as the exciting light for photoconductive elements 302 and 303.

When Indium-gallium-arsenic (InGaAs) is used as carrier-generating layer 103 of the photoconductive element, the reference wave component can be used as the exciting light for exciting the carriers. Thereby, the optical system for generating and taking-out the higher harmonics wave can be omitted.

Amplifier section 403 and dispersion-compensator section 405 are described in detail.

Figure 5:
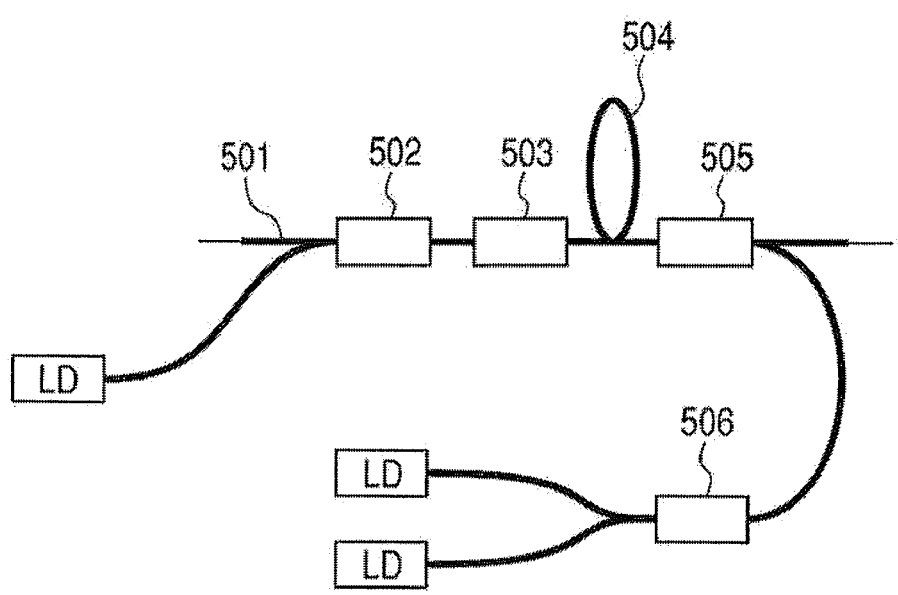
FIG. 5 illustrates an amplifier section.

FIG. 5 illustrates a constitution of amplifier section 403. Amplifier section 403 comprises three laser diodes (LD in FIG. 5), a single-mode fiber 501, WDM couplers 502 and 505, polarized light controller 503, Er-containing (erbium-containing) fiber 504, and polarized beam combiner 506. The term "WDM" signifies Wavelength-Division-Multiplexing.

Single-mode fiber 501 has, for the wavelength of 1.56 μm, a secondary group velocity dispersion of −21.4 ps$^2$/km, a mode field diameter of 9.3 μm, a non-linear coefficient of 1.89 W-1 km-1, and a fiber length of 4.5 m. Er-containing fiber 504 has, for the wavelength of 1.56 μm, a secondary group velocity dispersion of 6.44 ps$^2$/km, a mode field diameter of 8.0 μm, a non-linear coefficient of 2.55 W-1km-1, and a fiber length of 6.0 m. The three LDs emits a laser beam of a wavelength of 1480 nm, and an intensity of 400 mW. One of the LDs is employed for front side exciting and two of the LDs are employed for backside exciting as illustrated in FIG. 5.

The pulse width of the laser beam emitted from fetomsecond fiber laser 401 is expanded in single-mode fiber 501 under the influence of the group velocity dispersion to suppress temporarily the peak intensity of the beam pulse. Thereby an excessive non-linear effect is prevented in transmission of the pulsed light beam through Er-containing fiber 504, whereby the energy can effectively be amplified. With this constitution, the intensity of the pulsed light beam can have an average intensity of about 20 dB.

Figure 6:
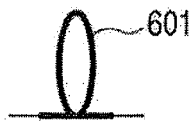
FIG. 6 illustrates a dispersion compensator of a fiber laser.

FIG. 6 illustrates a constitution of dispersion compensation section 405. Dispersion compensation section 405 has a dispersion characteristic reverse to that of amplification section 403. The band of the pulsed light beam output from amplification section 403 tends to spread under the influence of self phase modulation in Er-containing fiber 504. Therefore, dispersion compensation section 405 compensates the dispersion in the respective wavelengths to obtain a pulse having a pulse width shorter than that of femto-second fiber laser 401. In this Example, dispersion compensation section 405 employs dispersion compensating fiber 601. Specifically, a large-diameter photonic crystal fiber is used as dispersion compensating fiber 601. In this Example, the dispersion compensating fiber 601 has, for the wavelength of 1.56 μm, a secondary group velocity dispersion of −30.3 ps$^2$/km, a mode field diameter of 26 μm, a non-linear coefficient of 0.182 W-1km-1, and a fiber length of 0.42 m. With this constitution, the produced pulsed light beam has a pulse width of about 55 fsec, and an average intensity of about 280 mW.

As described above, in this Example, for photoconductive elements 302, 303 containing LT-GaAs as carrier generation layer 103, a second harmonic wave is generated by PPLN 408 as the exciting light. PPLN 408 generates also a basic wave component (1550 nm) in addition to the higher harmonics component (780 nm). The components are separated by dichroic mirror 410. PPLN 408 generates also green light slightly as a third harmonic wave. This green light is removed by green-cut filter 409. With this constitution, the pulsed light beam of 780-nm band has a pulse width of about 58 fsec and an average intensity of about 60 mW, and the pulsed light beam of 1550-nm band has a pulse width of about 64 fsec and an average intensity of about 170 mW.

Figure 7A:
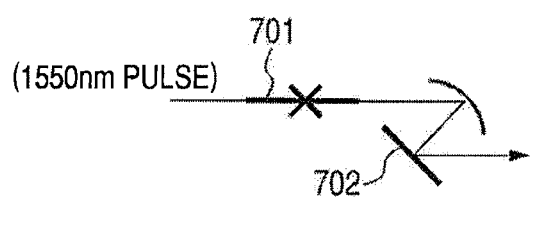
FIGS. 7A and 7B illustrate a constitution for pulse compression.
Figure 7B:
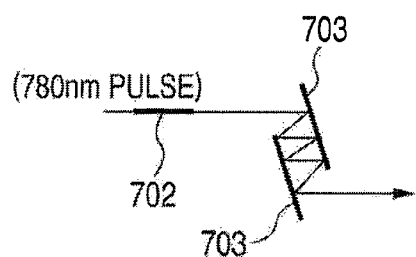

As described above, the pulse width of the exciting light beam generated by fiber laser 301 affects the resolution of the imaging apparatus in the depth direction. To cancel the influence, the pulse can be compressed by use of a highly-nonlinear fiber as illustrated in FIGS. 7A and 7B. FIG. 7A illustrates a constitution for compressing the optical pulse in 1550-nm band. FIG. 7B illustrates a constitution for compressing the optical pulse in 780-nm band. The method of the pulse compression is not limited thereto.

In FIG. 7A, the pulse in the 1550-nm band is compressed by use of single-mode fiber 701 and highly-nonlinear fiber 702. Single mode fiber 701 has, for the wavelength of 1.56 μm, a secondary group velocity dispersion of −21.4 ps$^2$/km, and a non-linear coefficient of 1.89 W-1km-1, and a fiber length of 0.115 m. Highly-nonlinear fiber 702 has, for the wavelength of 1.56 μm, a secondary group velocity dispersion of −14.6 ps$^2$/km, and a non-linear coefficient of 4.53 W-1km-1, and a fiber length of 0.04 m. The pulsed light beam output from the fiber is collimated by a parabolic mirror to prevent spreading of the pulse by dispersion in the lens. With such a constitution, the pulse light beam has a pulse width of about 22 fsec, and an average intensity of about 120 mW.

In FIG. 7B, the pulse in the 780-nm band is compressed by use of highly nonlinear fiber 702 and chirp mirrors 703. Chirp mirrors 703 conduct negative dispersion, adding the dispersion of about −35 fs2 by every reflection. The pulsed light beam is compressed by several times of reflection between chirp mirrors 703. Highly nonlinear fiber 702 has a length of 1 m. With such a constitution, the pulsed light beam has a pulse width of about 37 fsec, and an average intensity of about 30 mW. This Example utilizes this pulsed light beam as the exciting light beam for the photoconductive element. The constitution and parameters of fiber laser 301 are not limited to those mentioned above, but may be selected suitably to meet the objects.

With reference to FIG. 3 again, photoconductive element 302 of the generation side at least has a constitution described in Example 1 or 3, having a broad band characteristic. On the other hand, photoconductive element 303 of the detection side may be the same as that of the generation side or may be a usual element like that employed in a terahertz time domain spectrometer (THz-TDS). Driver 304 applies a necessary voltage to photoconductive element 302: the voltage may be DC or periodic.

Beam splitter 306 splits the output from fiber laser 301 having the above constitution, and transmits one portion to photoelectric element 302 and the other portion to delaying section 307.

Delaying section 307 is constituted of a usual delaying optical system, and changes the timing of the irradiation of an light pulse on photoconductive element 303 temporally. Detection section 305 detects the signal output from photoconductive element 303 and memorizes the signals corresponding to the timing of irradiation of the pulsed light beam set by delaying section 307. Thereby, the time-waveform relation of the terahertz wave reflected by sample 308 is reconstructed to obtain the information on sample 308 in the depth direction of the sample.

In FIG. 3, a mechanism may additionally be provided to change the positions of sample 308 relative to the terahertz wave irradiation spot for three-dimensional imaging of sample 308. The constitution of this Example can be applied to a transmission type or reflection type of THz-TDS apparatus.

Figure 24A:
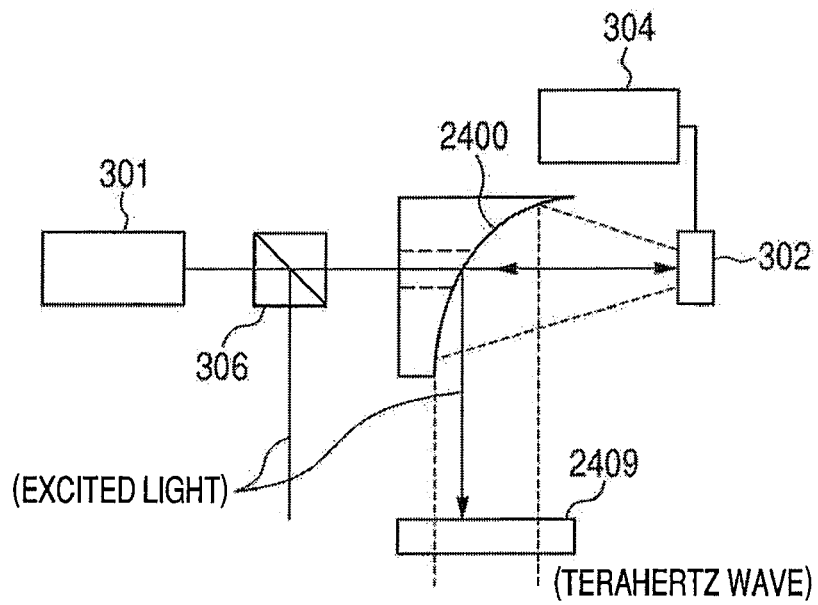
FIGS. 24A and 24B illustrates another example of generation of a terahertz wave.
Figure 24B:
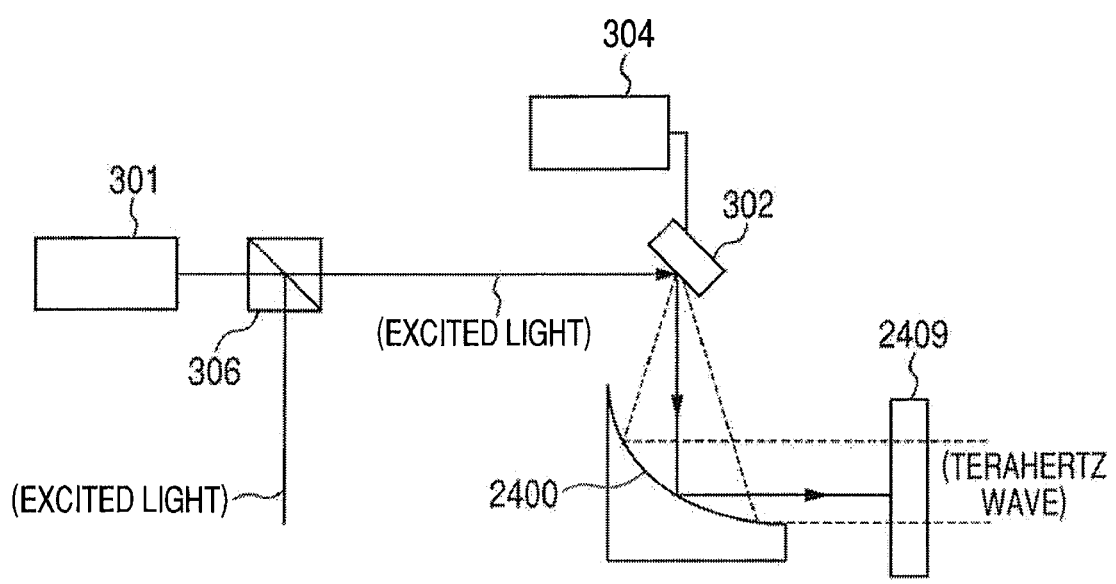

In the constitution illustrated in FIG. 3 with photoconductive element 302, an exciting light beam is projected onto antennas 101, and the generated terahertz wave is taken out from substrate 105. However, the constitution is not limited thereto. For example, as illustrated in FIGS. 24A and 24B, the exciting light beam may be projected onto antennas 101 and the terahertz wave may be taken out from antennas 101. In the constitution, the exciting light for terahertz wave generation is transmitted through the transmission path as illustrated in FIGS. 24A and 24B. The numeral 2400 denotes a parabolic mirror. In FIGS. 24A and 24B, an unnecessary signal is removed by filter 2409 placed in the terahertz wave transmission path. Filter 2409 intercepts the exciting light, and allows the terahertz wave to pass. For example, for the basic wave component (1550 nm) as the exciting light, a germanium (Ge) substrate is useful: for the higher harmonic wave component (780 nm) as the exciting wave, a Si substrate is useful. The constitution of filter 2409 is not limited thereto. With such a constitution, the absorption of the terahertz wave by substrate 105 of photoconductive element 302 can be decreased to use a terahertz wave in a broader band region. In the detection operation also, the above constitution is useful in which the terahertz wave and the exciting light are introduced to antenna 101.

As described above, the imaging apparatus of this Example comprises at least a photoconductive element of the present invention, an ultrashort pulse laser for generating carriers by irradiating the gap of the antennas, and a driver connected to the electrodes for controlling the propagation state of the generated carriers. For measurement, the terahertz wave generated in the photoconductive element is projected to a measurement object, and the terahertz waves reflected by the surface of the measurement object and by the refractive index interface in the interior thereof are detected, and therefrom the information on the inside structure of the measurement object is derived. For this operation, the frequency characteristic is preferably leveled.

With the above constitution, a terahertz wave having a shape in a nearly monocycle shape can be utilized in the imaging apparatus, and imaging can be made in the depth direction with high resolution. Further, use of a fiber laser as the exciting light source for the photoconductive element can make the apparatus smaller and less expensive.

Example 6

Communication Apparatus

This Example describes a constitution of a communication apparatus of the present invention for transmitting information, employing the above-described photoconductive element and the fiber laser. The matters common to the above Examples are not described redundantly.

This example describes, in particular, a transmission assembly of a communication apparatus. The apparatus of this Example localizes the terahertz wave in a band region corresponding to the atmospheric window, and utilizes the localized terahertz wave as a carrier wave. The term "atmospheric window" signifies a wavelength band in which the influence of the absorption by the atmospheric air is less and the light transmissivity is high.

Figure 8:
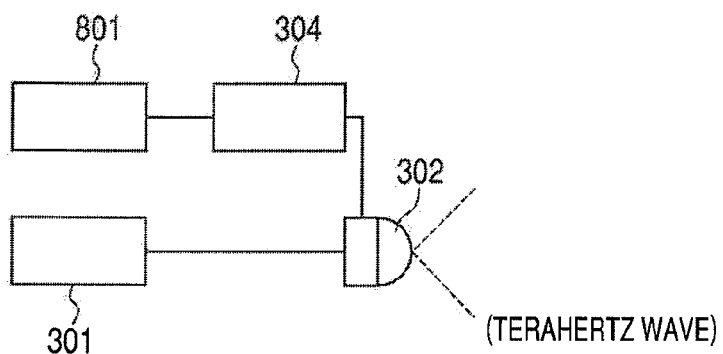
FIG. 8 illustrates a constitution of a communication apparatus employing the photoconductive element.

FIG. 8 illustrates a transmission assembly of the communication apparatus of this Example. The transmission assembly of the communication apparatus is constituted of fiber laser 301, photoconductive element 302, driver 304, and modulator 801, as illustrated in FIG. 8. Photoconductive element 302 has a constitution described in Example 2 or 3. The atmospheric windows are known to be at approximate frequencies of 0.38 THz, 0.71 THz, 0.86 THz, 1.05 THz, and 1.38 THz. In this Example, the adjusting stubs 202 are selected to localize the frequency characteristic to the frequency corresponding to the atmospheric window.

Figure 11A:
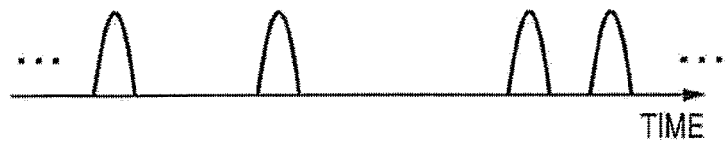
FIGS. 11A, 11B, and 11C illustrate the function of a modulator in the communication apparatus.
Figure 11B:
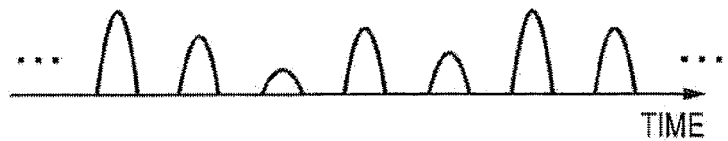

Modulator 801 controls driver 304 in accordance with the signal component of the information to be transmitted, and modulates the terahertz wave emitted from photoconductive element 302. The modulation is conducted, in one system, by switching the voltage applied to photoconductive element 302 as illustrated in FIG. 11A by means of driver 304, and a signal is transmitted by ON/OFF of the terahertz wave. In another system, the amplitude of the terahertz is modulated by the voltage applied to photoconductive element 302 as illustrated in FIG. 11B.

Figure 9:
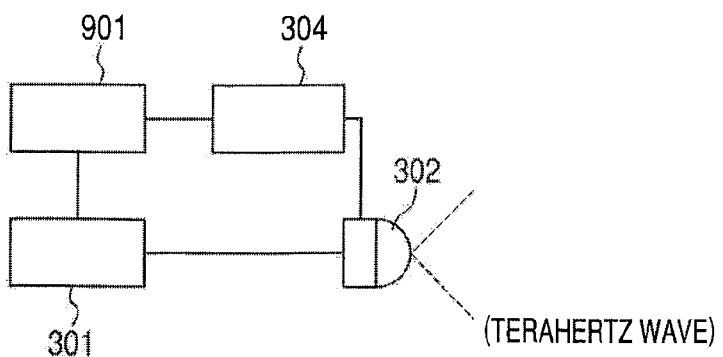
FIG. 9 illustrates another constitution of a communication apparatus employing the photoconductive element.
Figure 11C:
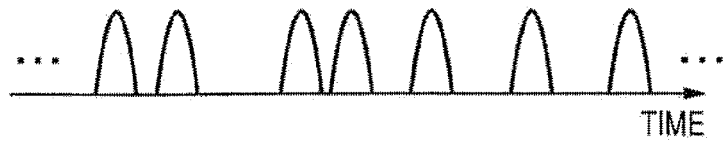

FIG. 9 illustrates another transmission assembly of the communication apparatus. In FIG. 9, modulator 901 modulates the emission timing and radiation intensity of fiber laser 301, not controlling driver 304. With this constitution, the phase (delay time) of the terahertz wave can be modified as illustrated in FIG. 11C, in addition to the modulation system for FIGS. 11A and 11B. Modulators 801 and 901 are constituted of a usual circuit and a usual computer.

Figure 10:
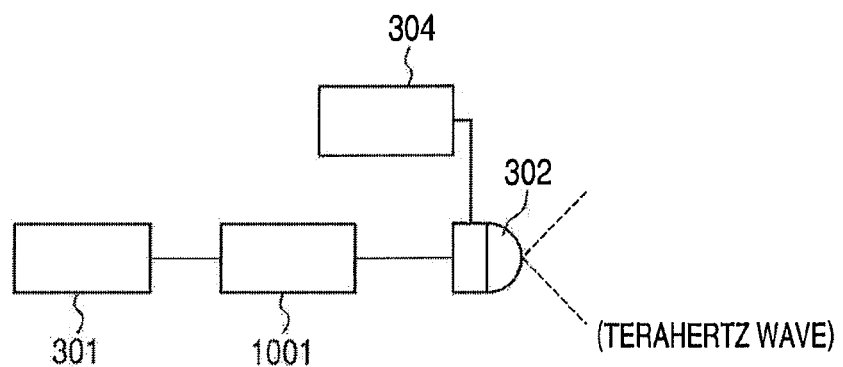
FIG. 10 illustrates still another constitution of a communication apparatus employing the photoconductive element.

FIG. 10 illustrates still another transmission assembly of the communication apparatus. In FIG. 10, modulator 1001 controls light pulse output from fiber laser 301. For example, the modulator controls the timing of arrival of the light pulse at photoconductive element 302 by stretching the fiber mechanically, or modulates the intensity of the light pulse by use of an attenuator, or turns the light pulse on and off by means of a switching device. However, the constitution or control object of the modulator is not limited thereto. The generated terahertz itself may be modulated. In an example, the position of photoconductive element 302 is changed relative to the direction of projection of the terahertz wave to achieve the modulation state illustrated in FIG. 11C. In short, the frequency characteristic of the terahertz wave is localized to the wavelength band corresponding to the atmospheric window, and the signal is superposed this localized frequency characteristic.

In this Example, the frequency characteristic of the terahertz wave is localized to the atmospheric window. However, the localization is not limited thereto. For example, the characteristic is localized to avoid absorption by the atmosphere surrounding the apparatus or to avoid characteristic absorption by a constituting member. The constitution of this Example may be applied to a transmission type or a reflection type of THz-TDS apparatus. Further, like in Example 6, the output from fiber laser 301 can be selected to be either in the 1550 nm band or in the 780 nm band, with suitable selection of the constitution of carrier generation layer 103 of photoconductive element 302 for the output wavelength band of fiber laser 301.

As described above, the communication apparatus in this Example comprises at least a photoconductive element of the present invention, an ultrashort pulse laser for generating carriers by projection of the output to the gap of the antennas, a driver connected to the electrodes for controlling the propagation state of the generated carriers, and a modulator. The modulator modulates the signals to be transmitted to the electrodes, or the output from the ultrashort pulse laser in accordance with transmitted information. The communication apparatus conducts communication with a terahertz wave having the frequency characteristic localized so as to decrease the component of the terahertz wave corresponding to the characteristic wavelength band of atmospheric air.

The above constitution enable effective transmission of the terahertz wave by avoiding the characteristic absorption by the atmosphere. Further, the use of the fiber laser made the apparatus smaller stabler, and less expensive.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-164439, filed Jun. 22, 2007, which is hereby incorporated by reference herein in its entirety.

What is claimed is:

1. A photoconductive element for generating or detecting a terahertz wave, comprising:
   a carrier generation layer for generating carriers on light irradiation;
   a pair of conductive electrodes provided in opposition on one face of the carrier generation layer, each containing a strip line;
   a pair of conductive antennas placed in opposition with a gap for light irradiation onto the carrier generation layer, each being joined to the electrodes;
   a pair of conductive adjusting stubs for adjusting a propagation state of the terahertz wave generated or detected by the carriers;
   wherein each of the adjusting stubs has a length of not longer than the wavelength λ of the terahertz wave generated by the carriers, and is placed at a distance of not more than the wavelength λ from a joint between the antenna and the electrode.

2. The photoconductive element according to claim 1, wherein the wavelength λ is twice the interspace d between the strip lines.

3. An imaging apparatus comprising
   a photoconductive element according to claim 1, an ultrashort pulse laser for generating carriers by applying a generating power to the gap of the antenna,
   a driver connected to the electrode for controlling a carrier propagation state,
   whereby information on an inside structure of a measurement object is obtained by generating a terahertz wave by the photoconductive element and receiving a reflected terahertz wave reflected at the surface layer and a refractive index interface inside.

4. A communication apparatus comprising
   a photoconductive element according to claim 1, an ultrashort pulse laser for generating carriers by applying a generating power,
   a driver connected to the electrode for controlling a carrier propagation state of the generated carriers,
   and a modulator for modulating a signal input to the electrodes by the driver or an output from the ultrashort pulse laser in accordance with the transmitted information;
   whereby communication is conducted by use of a terahertz wave having a frequency characteristic localized to reduce a terahertz wave component in the characteristic absorption wavelength band of the atmospheric air in the frequency band of the terahertz wave.

5. A photoconductive element for generating or detecting a terahertz wave, comprising:
   a carrier generation layer for generating carriers on light irradiation;
   a pair of conductive electrodes provided in opposition on one face of the carrier generation layer, each containing a strip line;
   a pair of conductive antennas placed in opposition with a gap for light irradiation onto the carrier generation layer, each being joined to the electrodes;
   a pair of conductive adjusting stubs for adjusting a propagation state of the terahertz wave generated or detected by the carriers;
   wherein each of the adjusting stubs has a length of not longer than the wavelength λ of the terahertz wave generated by the carriers, and is joined to extension of the strip line, and the end of the adjusting stub is placed at a distance of not more than the wavelength λ from a joint between the antenna and the electrode.

6. The photoconductive element according to claim 5, wherein each of the conductive adjusting stubs is joined to extension of the strip line, and has a length ranging from 0.5λ to 0.8λ from the joint between the antenna and the electrode, and thereby the pair of the adjusting stubs level a frequency characteristic of the terahertz wave generated or detected by the carriers.

7. The photoconductive element according to claim 5, wherein each of the conductive adjusting stubs is joined to extension of the strip line, and has a length ranging from 0.1λ to 0.5λ from the joint between the antenna and the electrode, and thereby the pair of the adjusting stubs localize a frequency characteristic of the terahertz wave generated or detected by the carriers.

8. The photoconductive element according claim 5, wherein the wavelength λ is twice the interspace d between the strip lines.

9. An imaging apparatus comprising
   a photoconductive element according to claim 5, an ultrashort pulse laser for generating carriers by applying a generating power to the gap of the antenna,
   a driver connected to the electrode for controlling a carrier propagation state,
   whereby information on an inside structure of a measurement object is obtained by generating a terahertz wave by the photoconductive element and receiving a reflected terahertz wave reflected at the surface layer and a refractive index interface inside.

10. A communication apparatus comprising
    a photoconductive element according to claim 5, an ultrashort pulse laser for generating carriers by applying a generating power,
    a driver connected to the electrode for controlling a carrier propagation state of the generated carriers, and a modulator for modulating a signal input to the electrodes by the driver or an output from the ultrashort pulse laser in accordance with the transmitted information;
    whereby communication is conducted by use of a terahertz wave having a frequency characteristic localized to reduce a terahertz wave component in the characteristic absorption wavelength band of the atmospheric air in the frequency band of the terahertz wave.

11. A photoconductive element for generating or detecting a terahertz wave, comprising:
    a carrier generation layer for generating carriers on light irradiation;
    a pair of conductive electrodes provided on one face of the carrier generation layer and each containing a strip line in opposition;
    a pair of conductive antennas placed in opposition with a gap for light irradiation onto the carrier generation layer, and each being joined to the electrodes;
    a pair of conductive adjusting stabs for adjusting a propagation state of the terahertz wave generated or detected by the carriers;
    wherein each of the adjusting stubs has a length of not longer than the wavelength λ of the terahertz wave generated by the carriers, and is joined to the electrode at the outside edge of the strip line at a distance of not more than the wavelength λ from a joint between the antenna and the electrode.

12. The photoconductive element according to claim 11, wherein each of the adjusting stubs has a length ranging from 0.1λ to 0.2λ, and is joined to the outside edge of the strip line at a distance equal to the length of the stub from the joint between antenna and the electrode, whereby the adjusting stubs level the frequency characteristic of the terahertz wave generated or detected by the carriers.

13. The photoconductive element according to claim 11, wherein each of the adjusting stubs has a length ranging from 0.2λ to 0.5λ, and is joined to the outside edge of the strip line at a distance equal to the length of the stub from the joint between antenna and the electrode, whereby the adjusting stubs localize the frequency characteristic of the terahertz wave generated or detected by the carriers.

14. The photoconductive element according to claim 11, wherein the wavelength λ is twice the interspace d between the strip lines.

15. An imaging apparatus comprising
a photoconductive element according to claim 11,
an ultrashort pulse laser for generating carriers by applying a generating power to the gap of the antenna,
a driver connected to the electrode for controlling a carrier propagation state,
whereby information on an inside structure of a measurement object is obtained by generating a terahertz wave by the photoconductive element and receiving a reflected terahertz wave reflected at the surface layer and a refractive index interface inside.

16. A communication apparatus comprising
a photoconductive element according to claim 11,
an ultrashort pulse laser for generating carriers by applying a generating power,
a driver connected to the electrode for controlling a carrier propagation state of the generated carriers,
and a modulator for modulating a signal input to the electrodes by the driver or an output from the ultrashort pulse laser in accordance with the transmitted information;
whereby communication is conducted by use of a terahertz wave having a frequency characteristic localized to reduce a terahertz wave component in the characteristic absorption wavelength band of the atmospheric air in the frequency band of the terahertz wave.

17. A photoconductive element for generating or detecting a terahertz wave, comprising a carrier generation layer for generating carriers on irradiation of a beam of light, a first electrode provided on a face of the carrier generation layer, a second electrode provided on the face of the carrier generation layer placed in opposition to the first electrode,
wherein the first electrode and the second electrode have respectively an antenna, the beam of light is projected onto a spot in a gap of the antennas joined to the first electrode and the second electrode, and at least one of the ends of the first electrode and the second electrode is placed at a distance from the spot of the light projection of not longer than twice the interspace d between the first electrode and the second electrode.

18. An imaging apparatus comprising
a photoconductive element according to claim 17,
an ultrashort pulse laser for generating carriers by applying a generating power to the gap of the antenna,
a driver connected to the electrode for controlling a carrier propagation state,
whereby information on an inside structure of a measurement object is obtained by generating a terahertz wave by the photoconductive element and receiving a reflected terahertz wave reflected at the surface layer and a refractive index interface inside.

19. A communication apparatus comprising
a photoconductive element according to claim 17,
an ultrashort pulse laser for generating carriers by applying a generating power,
a driver connected to the electrode for controlling a carrier propagation state of the generated carriers, and a modulator for modulating a signal input to the electrodes by the driver or an output from the ultrashort pulse laser in accordance with the transmitted information;
whereby communication is conducted by use of a terahertz wave having a frequency characteristic localized to reduce a terahertz wave component in the characteristic absorption wavelength band of the atmospheric air in the frequency band of the terahertz wave.

20. A photoconductive element for generating or detecting a terahertz wave, comprising a carrier generation layer for generating carriers on irradiation of a beam of light, a first electrode provided on a face of the carrier generation layer, a second electrode provided on the face of the carrier generation layer placed in opposition to the first electrode,
wherein the first electrode and the second electrode have respectively an antenna, the beam of light is projected onto a spot in a gap of the antennas joined to the first electrode and the second electrode, and a pair of conductive adjusting stubs are placed in opposition on the first electrode and second electrode at a distance from the spot of the light projection of not longer than twice the interspace d between the first electrode and the second electrode.

21. An imaging apparatus comprising
a photoconductive element according to claim 20,
an ultrashort pulse laser for generating carriers by applying a generating power to the gap of the antenna,
a driver connected to the electrode for controlling a carrier propagation state,
whereby information on an inside structure of a measurement object is obtained by generating a terahertz wave by the photoconductive element and receiving a reflected terahertz wave reflected at the surface layer and a refractive index interface inside.

22. A communication apparatus comprising
a photoconductive element according to claim 20,
an ultrashort pulse laser for generating carriers by applying a generating power,
a driver connected to the electrode for controlling a carrier propagation state of the generated carriers,
and a modulator for modulating a signal input to the electrodes by the driver or an output from the ultrashort pulse laser in accordance with the transmitted information;
whereby communication is conducted by use of a terahertz wave having a frequency characteristic localized to reduce a terahertz wave component in the characteristic absorption wavelength band of the atmospheric air in the frequency band of the terahertz wave.

23. A photoconductive element for generating or detecting a terahertz wave, comprising:
a carrier generation layer for generating carriers,
antennas formed from a conductive material in opposition with a gap on the carrier generation layer,
two electrodes containing respectively a strip line formed from a conductive material for controlling a propagation state of the carriers produced in the gap of the antennas,
one or more pairs of adjusting stubs for adjusting the state of the generated or detected terahertz wave,
wherein the antennas are placed between the strip lines and joined to the strip lines, and the one or more pairs of adjusting stubs include at least first adjusting stubs and second adjusting stubs formed from a conductive material having a stub length of not more than the wavelength λ defined by the interspace between the conductive strip lines, the first adjusting stubs are placed on extension of the strip lines and having the tip ends at a distance of not more than the wavelength λ from the joint between the antenna and the electrode, and the second adjusting stubs are joined to the outside edges of the strip lines at a distance of not more than the wavelength λ from the joint between the antenna and the electrode.

24. An imaging apparatus comprising a photoconductive element according to claim 23, an ultrashort pulse laser for generating carriers by applying a generating power to the gap of the antenna, a driver connected to the electrode for controlling a carrier propagation state, whereby information on an inside structure of a measurement object is obtained by generating a terahertz wave by the photoconductive element and receiving a reflected terahertz wave reflected at the surface layer and a refractive index interface inside.

25. A communication apparatus comprising a photoconductive element according to claim 23, an ultrashort pulse laser for generating carriers by applying a generating power, a driver connected to the electrode for controlling a carrier propagation state of the generated carriers, and a modulator for modulating a signal input to the electrodes by the driver or an output from the ultrashort pulse laser in accordance with the transmitted information;

whereby communication is conducted by use of a terahertz wave having a frequency characteristic localized to reduce a terahertz wave component in the characteristic absorption wavelength band of the atmospheric air in the frequency band of the terahertz wave.

* * * * *